US010937726B1

(12) United States Patent
Chen et al.

(10) Patent No.: US 10,937,726 B1
(45) Date of Patent: Mar. 2, 2021

(54) PACKAGE STRUCTURE WITH EMBEDDED CORE

(71) Applicant: Applied Materials, Inc., Santa Clara, CA (US)

(72) Inventors: Han-Wen Chen, Cupertino, CA (US); Steven Verhaverbeke, San Francisco, CA (US); Giback Park, San Jose, CA (US); Kyuil Cho, Santa Clara, CA (US); Kurtis Leschkies, San Jose, CA (US); Roman Gouk, San Jose, CA (US); Chintan Buch, Santa Clara, CA (US); Vincent DiCaprio, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/746,681

(22) Filed: Jan. 17, 2020

Related U.S. Application Data

(63) Continuation of application No. 16/698,680, filed on Nov. 27, 2019.

(51) Int. Cl.
*H01L 23/498* (2006.01)
*H01L 23/14* (2006.01)
*H01L 21/48* (2006.01)

(52) U.S. Cl.
CPC ...... *H01L 23/49838* (2013.01); *H01L 21/486* (2013.01); *H01L 23/147* (2013.01); *H01L 23/49827* (2013.01); *H01L 23/49866* (2013.01)

(58) Field of Classification Search
CPC . H01L 2224/73265; H01L 2224/32145; H01L 2224/05647; H01L 2924/181;
(Continued)

(56) References Cited

U.S. PATENT DOCUMENTS

| 5,268,194 A | 12/1993 | Kawakami et al. |
| 5,353,195 A | 10/1994 | Fillion et al. |

(Continued)

FOREIGN PATENT DOCUMENTS

| CA | 2481616 C | 1/2013 |
| CN | 1971894 A | 5/2007 |

(Continued)

OTHER PUBLICATIONS

S. W. Ricky Lee et al. "3D Stacked Flip Chip Packaging with Through Silicon Vias and Copper Plating or Conductive Adhesive Filling", 2005 IEEE, pp. 798-801.

(Continued)

*Primary Examiner* — Duy T Nguyen
(74) *Attorney, Agent, or Firm* — Patterson & Sheridan, LLP

(57) ABSTRACT

The present disclosure relates to semiconductor core assemblies and methods of forming the same. The semiconductor core assemblies described herein may be utilized to form semiconductor package assemblies, PCB assemblies, PCB spacer assemblies, chip carrier assemblies, intermediate carrier assemblies (e.g., for graphics cards), and the like. In one embodiment, a silicon substrate core is structured by direct laser patterning. One or more conductive interconnections are formed in the substrate core and one or more redistribution layers are formed on surfaces thereof. The silicon substrate core may thereafter be utilized as a core structure for a semiconductor package, PCB, PCB spacer, chip carrier, intermediate carrier, or the like.

20 Claims, 21 Drawing Sheets

(58) Field of Classification Search
CPC ..... H01L 2224/13147; H01L 21/76877; H01L 2224/05001; H01L 2224/0508; H01L 2224/05552; H01L 23/53238; H01L 23/5329; H01L 24/45; H01L 23/49838; H01L 23/147; H01L 23/49827; H01L 23/49866
USPC ........................................................ 257/668
See application file for complete search history.

(56) References Cited

U.S. PATENT DOCUMENTS

| | | | |
|---|---|---|---|
| 5,474,834 A | 12/1995 | Tanahashi et al. |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,087,719 A | 7/2000 | Tsunashima |
| 6,117,704 A | 9/2000 | Yamaguchi et al. |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,312,405 B2 | 12/2007 | Hsu |
| 7,321,164 B2 | 1/2008 | Hsu |
| 7,449,363 B2 | 11/2008 | Hsu |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,978,478 B2 | 7/2011 | Inagaki et al. |
| 7,982,305 B1 | 7/2011 | Railkar et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,649 B1 | 4/2014 | Huemoeller et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,515,912 B2 | 12/2019 | Lim et al. |
| 10,522,483 B2 | 12/2019 | Shuto |
| 10,553,515 B2 | 2/2020 | Chew |
| 10,658,337 B2 | 5/2020 | Yu et al. |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0135058 A1 | 9/2002 | Asahi et al. |
| 2002/0158334 A1 | 10/2002 | Vu et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |

(56) References Cited

U.S. PATENT DOCUMENTS

| | | |
|---|---|---|
| 2004/0080040 A1 | 4/2004 | Dotta et al. |
| 2005/0012217 A1 | 1/2005 | Mori et al. |
| 2006/0014532 A1 | 1/2006 | Seligmann et al. |
| 2006/0128069 A1 | 6/2006 | Hsu |
| 2006/0145328 A1 | 7/2006 | Hsu |
| 2006/0283716 A1* | 12/2006 | Hafezi ............... H01L 21/2885 205/291 |
| 2007/0035033 A1 | 2/2007 | Ozguz et al. |
| 2008/0173792 A1 | 7/2008 | Yang et al. |
| 2008/0173999 A1 | 7/2008 | Chung et al. |
| 2009/0243065 A1 | 10/2009 | Sugino et al. |
| 2009/0250823 A1 | 10/2009 | Racz et al. |
| 2010/0013081 A1 | 1/2010 | Toh et al. |
| 2010/0144101 A1 | 6/2010 | Chow et al. |
| 2011/0062594 A1 | 3/2011 | Maekawa et al. |
| 2011/0204505 A1 | 8/2011 | Pagaila et al. |
| 2011/0291293 A1 | 12/2011 | Tuominen et al. |
| 2011/0316147 A1 | 12/2011 | Shih et al. |
| 2012/0146209 A1* | 6/2012 | Hu .................... H01L 23/49833 257/692 |
| 2012/0164827 A1 | 6/2012 | Rajagopalan et al. |
| 2013/0286615 A1 | 10/2013 | Inagaki et al. |
| 2014/0103499 A1 | 4/2014 | Andry et al. |
| 2014/0252655 A1 | 9/2014 | Tran et al. |
| 2015/0228416 A1 | 8/2015 | Hurwitz et al. |
| 2015/0359098 A1 | 12/2015 | Ock |
| 2015/0380356 A1 | 12/2015 | Chauhan et al. |
| 2016/0020163 A1 | 1/2016 | Shimizu et al. |
| 2016/0049371 A1 | 2/2016 | Lee et al. |
| 2016/0336296 A1 | 11/2016 | Jeong et al. |
| 2017/0229432 A1 | 8/2017 | Lin et al. |
| 2018/0116057 A1 | 4/2018 | Kajihara et al. |
| 2018/0182727 A1 | 6/2018 | Yu |
| 2018/0308792 A1 | 10/2018 | Raghunathan et al. |
| 2018/0352658 A1 | 12/2018 | Yang |
| 2018/0376589 A1* | 12/2018 | Harazono .............. H05K 1/024 |
| 2019/0131224 A1 | 5/2019 | Choi et al. |
| 2019/0131270 A1 | 5/2019 | Lee et al. |
| 2019/0189561 A1 | 6/2019 | Rusli |
| 2019/0237430 A1* | 8/2019 | England ................ H01L 24/03 |
| 2019/0355680 A1 | 11/2019 | Chuang et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 104637912 A | 5/2015 |
| CN | 106531647 A | 3/2017 |
| CN | 108028225 A | 5/2018 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | 2001244591 A | 9/2001 |
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 2008052491 A | 6/2008 |
| KR | 20100097893 A | 9/2010 |
| KR | 101301507 B1 | 9/2013 |
| KR | 20140086375 A | 7/2014 |
| KR | 101494413 B1 | 2/2015 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | I594397 B | 8/2017 |
| WO | 2011130300 A1 | 10/2011 |
| WO | 2013008415 A1 | 1/2013 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |

OTHER PUBLICATIONS

K. Sakuma et al. "3D Stacking Technology with Low-Volume Lead-Free Interconnections", IBM T.J. Watson Research Center. 2007 IEEE, pp. 627-632.

Chien-Wei Chien et al "Chip Embedded Wafer Level Packaging Technology for Stacked RF-SiP Application",2007 IEEE, pp. 305-310.

Chien-Wei Chien et al. "3D Chip Stack With Wafer Through Hole Technology". 6 pages.

Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.

Junghoon Yeom', et al. "Critical Aspect Ratio Dependence in Deep Reactive Ion Etching of Silicon", 2003 IEEE. pp. 1631-1634.

Ronald Hon et al. "Multi-Stack Flip Chip 3D Packaging with Copper Plated Through-Silicon Vertical Interconnection", 2005 IEEE. pp. 384-389.

NT Nguyen et al. "Through-Wafer Copper Electroplating for Three-Dimensional Interconnects", Journal of Micromechanics and Microengineering. 12 (2002) 395-399. 2002 IOP.

Arifur Rahman. "System-Level Performance Evaluation of Three-Dimensional Integrated Circuits", vol. 8, No. 6, Dec. 2000. pp. 671-678.

L. Wang, et al. "High aspect ratio through-wafer interconnections for 3Dmicrosystems", 2003 IEEE. pp. 634-637.

Li-Cheng Shen et al. "A Clamped Through Silicon Via (TSV) Interconnection for Stacked Chip Bonding Using Metal Cap on Pad and Metal col. Forming in Via", 2008 IEEE.

Daquan Yu, "Embedded Silicon Fan-Out (eSiFO®) Technology for Wafer-Level System Integration", 2019 Advances in Embedded and Fan-Out Wafer-Level Packaging Technologies, First Edition. pp. 169-184.

Tailong Shi et al. "First Demonstration of Panel Glass Fan-out (GFO) Packages for High I/O Density and High Frequency Multi-Chip Integration", 2017 IEEE 67th Electronic Components and Technology Conference, 6 pages.

Amit Kelkar, et al. "Novel Mold-free Fan-out Wafer Level Package using Silicon Wafer", IMPAS 2016—49th International Symposium on Microelectronics—Pasadena, CA USA—Oct. 10-13, 2016, 5 pages.

Italian search report and written opinion for Application No. IT 201900006736 dated Mar. 2, 2020.

Italian Search Report and Written Opinion for Application No. IT 201900006740 dated Mar. 4, 2020.

Allresist Gmbh—Strausberg et al: "Resist-Wiki: Adhesion promoter HMDS and diphenylsilanedio (AR 300-80)—. . .—Allresist GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/ https://www.allresist.com/process-chemicals-adhesion-promoter-hmds-and-diphenylsilanedio/, [retrieved on Jan. 29, 2020].

International Search Report and Written Opinion for Application No. PCT/US2020/026832 dated Jul. 23, 2020.

Han et al. —"Process Feasibility and Reliability Performance of Fine Pitch Si Bare Chip Embedded in Through Cavity of Substrate Core," IEEE Trans. Components, Packaging and Manuf. Tech., vol.

(56) References Cited

OTHER PUBLICATIONS

5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Wu et al., Microelect. Eng., vol. 87 2010, pp. 505-509.
Han, Younggun, et al.—"Evaluation of Residual Stress and Warpage of Device Embedded Substrates with Piezo-Resistive Sensor Silicon Chips" technical paper, Jul. 31, 2015, pp. 81-94.
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Srinivasan, R., et al.—"Ultraviolet Laser Ablation of Organic Polymers," Chemical Reviews, 1989, vol. 89, No. 6, pp. 1303-1316.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology conference, pp. 544-549.
Shi, Tailong, et al.—"First Demonstration of Panel Glass Fan-out (GFO) Packages for High I/O Density and High Frequency Multichip Integration," Proceedings of 2017 IEEE 67th Electronic Components and Technology conference, May 30-Jun. 2, 2017, pp. 41-46.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
PCT International Search Report and Written Opinion dated Aug. 28, 2020, for International Application No. PCT/US2020/032245.

\* cited by examiner

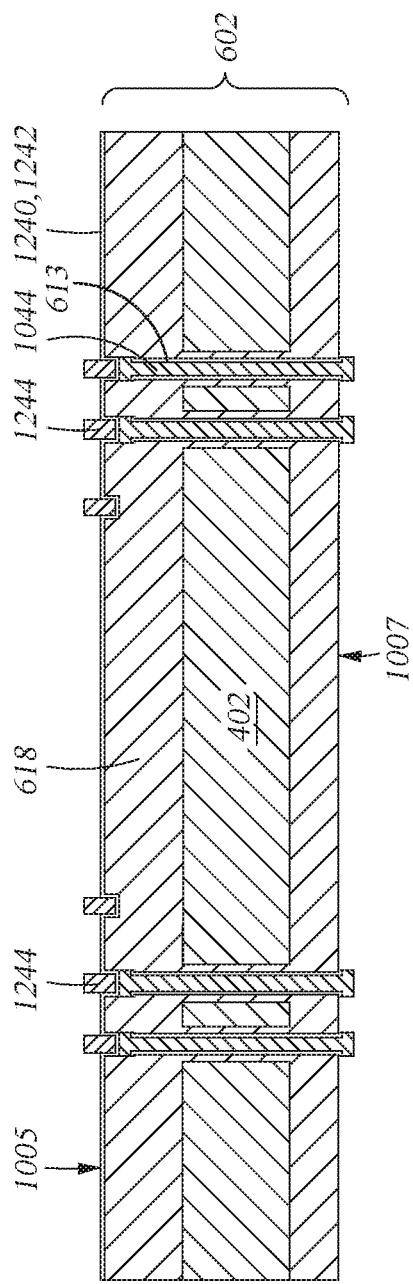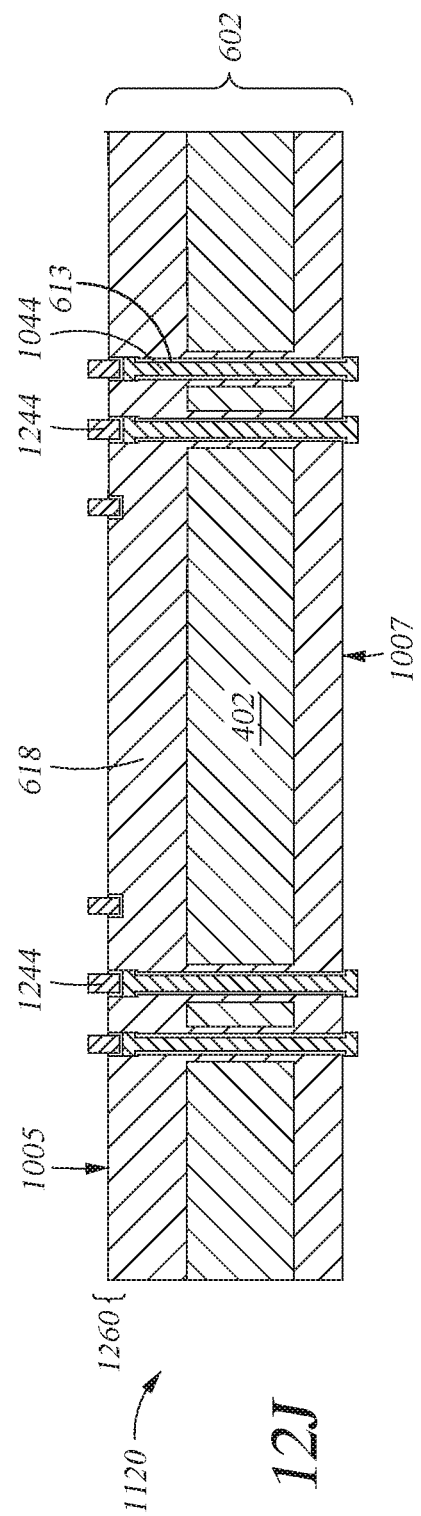

US 10,937,726 B1

PACKAGE STRUCTURE WITH EMBEDDED CORE

CROSS-REFERENCE TO RELATED APPLICATIONS

This application is a continuation of U.S. application Ser. No. 16/698,680, filed Nov. 27, 2019 which is herein incorporated by reference in its entirety.

BACKGROUND

Field

Embodiments of the present disclosure generally relate to electronic mounting structures and methods of forming the same. More specifically, embodiments described herein relate to semiconductor package and PCB assemblies and methods of forming the same.

Description of the Related Art

Due to an ever-increasing demand for miniaturized electronic devices and components, the demand for faster processing capabilities with greater circuit densities imposes corresponding demands on the materials, structures, and processes used in the fabrication of such integrated circuit chips. Alongside these trends toward greater integration and performance, however, there exists the perpetual pursuit for reduced manufacturing costs.

Conventionally, integrated circuit chips have been fabricated on organic package substrates coupled to circuit boards (e.g. printed circuit boards (PCB's)) due to the ease of forming features and connections in the organic package substrates, as well as the relatively low package manufacturing costs associated with organic composites. However, as circuit densities are increased and electronic devices are further miniaturized, the utilization of organic package substrates and conventional interconnect PCB's becomes impractical due to limitations with material structuring resolution to sustain device scaling and associated performance requirements. More recently, 2.5D and 3D integrated circuits have been fabricated utilizing passive silicon interposers as redistribution layers to compensate for some of the limitations associated with organic package substrates. Silicon interposer utilization is driven by the potential for high-bandwidth density, lower-power chip-to-chip communication, and heterogeneous integration sought in advanced electronic mounting and packaging applications. Yet, the formation of features in silicon interposers, such as through-silicon vias (TSVs), is still difficult and costly. In particular, high costs are imposed by high-aspect-ratio silicon via etching, chemical mechanical planarization, and semiconductor back end of line (BEOL) interconnection.

Therefore, what is needed in the art are improved semiconductor package and PCB core assemblies having increased densities and methods of forming the same.

SUMMARY

The present disclosure generally relates to electronic mounting structures and methods of forming the same.

In one embodiment, a semiconductor device assembly is provided. The semiconductor device assembly includes a silicon core structure having a first surface opposing a second surface and a thickness less than about 1000 μm. One or more conductive interconnections are formed through the silicon core structure and protrude from the first surface and the second surface. The semiconductor device assembly further includes a first redistribution layer formed on the first surface and a second redistribution layer formed on the second surface. The first redistribution layer and the second redistribution layer each have one or more conductive contacts formed thereon.

In one embodiment, a semiconductor device assembly is provided. The semiconductor device assembly includes a silicon core structure, a passivating layer, and a dielectric layer. The silicon core structure has a thickness less than about 1000 μm. The passivating layer surrounds the silicon core structure and includes a thermal oxide. The dielectric layer is formed on the passivating layer and includes an epoxy resin having silica particles disposed therein.

In one embodiment, a semiconductor device assembly is provided. The semiconductor device includes a silicon core structure, a passivating layer surrounding the silicon structure and including a thermal oxide, a dielectric layer surrounding the passivating layer and formed of an epoxy resin, and a redistribution layer formed on the dielectric layer. The redistribution layer further includes an adhesion layer formed on the dielectric layer and formed of molybdenum, a copper seed layer formed on the adhesion layer, and a copper layer formed on the copper seed layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 12A-12L schematically illustrate cross-sectional views of the semiconductor core assembly at different stages of the process depicted in FIG. 11, according to an embodiment described herein.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

The present disclosure relates to semiconductor core assemblies and methods of forming the same. The semiconductor core assemblies described herein may be utilized to form semiconductor package assemblies, PCB assemblies, PCB spacer assemblies, chip carrier assemblies, intermediate carrier assemblies (e.g., for graphics cards), and the like. In one embodiment, a silicon substrate core is structured by direct laser patterning. One or more conductive interconnections are formed in the substrate core and one or more redistribution layers are formed on surfaces thereof. The silicon substrate core may thereafter be utilized as a core structure for a semiconductor package, PCB, PCB spacer, chip carrier, intermediate carrier, or the like.

The methods and apparatus disclosed herein include novel thin-form-factor semiconductor core structures intended to replace more conventional semiconductor package, PCB, and chip carrier structures utilizing glass fiber-filled epoxy frames. Generally, the scalability of current semiconductor packages, PCBs, spacers, and chip carriers is limited by the rigidity and lack of planarity of the materials typically utilized to form these various structures (e.g., epoxy molding compound, FR-4 and FR-5 grade woven fiberglass cloth with epoxy resin binders, and the like). The intrinsic properties of these materials cause difficulty in patterning and utilizing fine (e.g., micron scale) features formed therein. Furthermore, as a result of the properties (e.g., insulativity) of currently-utilized materials, coefficient of thermal expansion (CTE) mismatch may occur between fiberglass frames, boards, molding compounds, and any chips disposed adjacent thereto. Therefore, current package, PCB, spacer, and carrier structures necessitate larger solder bumps with greater spacing to mitigate the effect of any warpage caused by CTE mismatch. Accordingly, conventional semiconductor package, PCB, spacer, and carrier frames are characterized by low through-structure electrical bandwidths, resulting in decreased overall power efficiency. The methods and apparatus disclosed herein provide semiconductor core structures that overcome many of the disadvantages associated with conventional semiconductor package, PCB, spacer, and carrier structures described above.

Figure 1A:
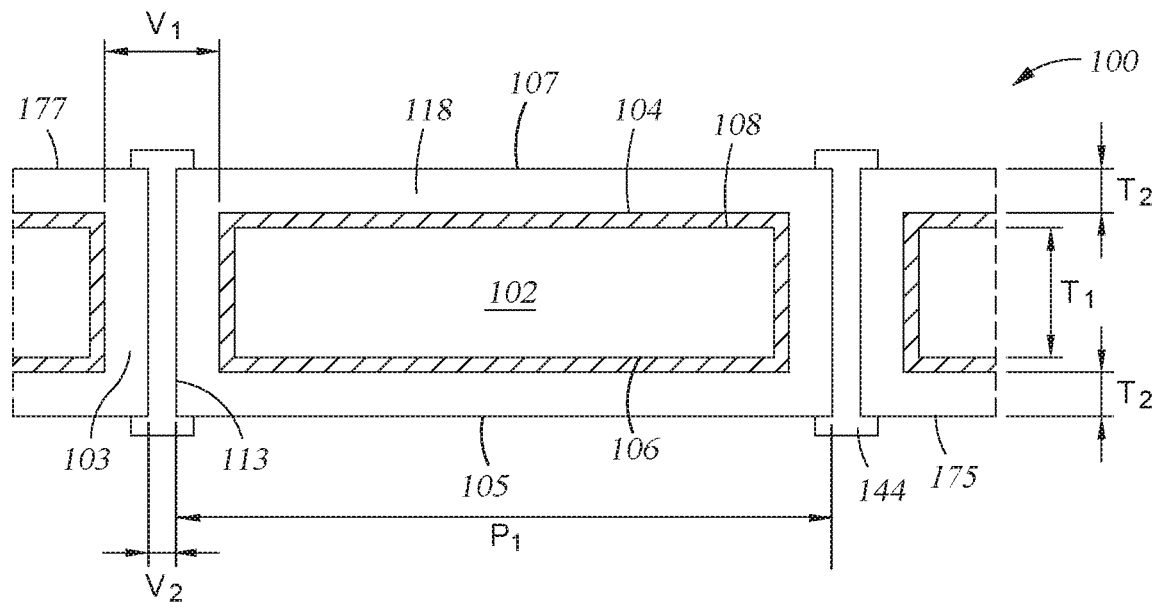
FIG. 1A schematically illustrates a cross-sectional view of a semiconductor core assembly, according to an embodiment described herein.
Figure 1B:
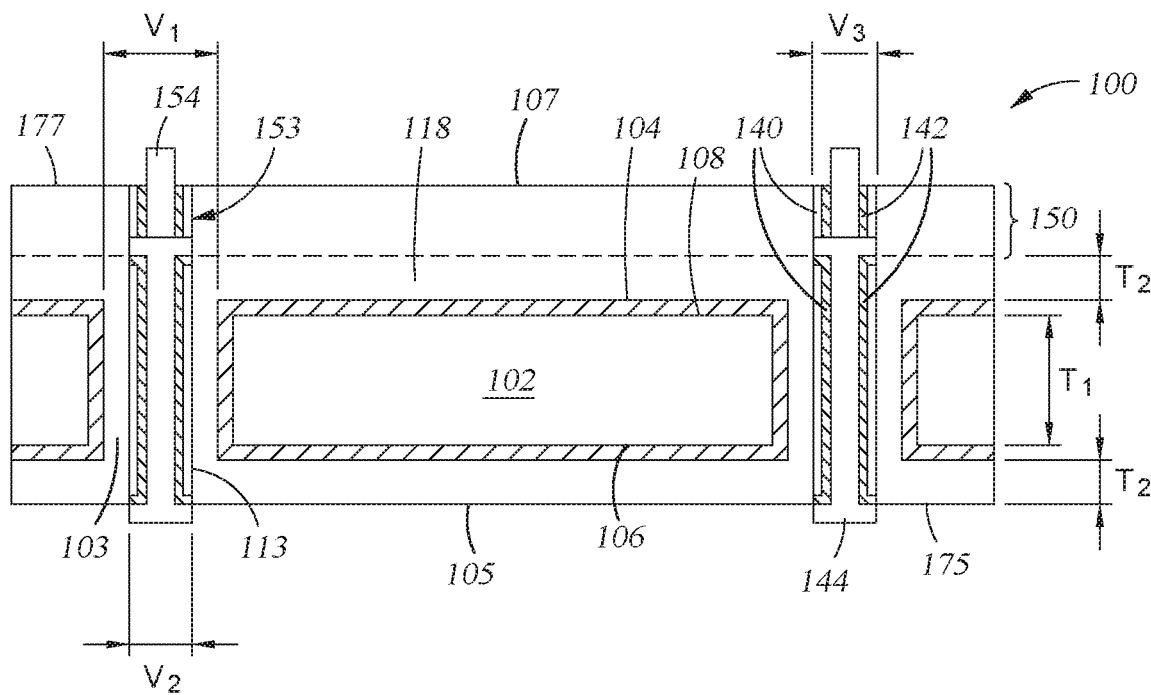
FIG. 1B schematically illustrates a cross-sectional view of a semiconductor core assembly, according to an embodiment described herein.

FIGS. 1A and 1B illustrate cross-sectional views of a thin-form-factor semiconductor core assembly 100 according to some embodiments. The semiconductor core assembly 100 may be utilized for structural support and electrical interconnection of semiconductor packages mounted thereon. In further examples, the semiconductor core assembly 100 may be utilized as a carrier structure for a surface-mounted device, such as a chip or graphics card. The semiconductor core assembly 100 generally includes a core structure 102, an optional passivating layer 104, and an insulating layer 118.

In one embodiment, the core structure 102 includes a patterned (e.g., structured) substrate formed of any suitable substrate material. For example, the core structure 102 includes a substrate formed from a III-V compound semiconductor material, silicon, crystalline silicon (e.g., Si<100> or Si<111>), silicon oxide, silicon germanium, doped or undoped silicon, doped or undoped polysilicon, silicon nitride, quartz, glass (e.g., borosilicate glass), sapphire, alumina, and/or ceramic materials. In one embodiment, the core structure 102 includes a monocrystalline p-type or n-type silicon substrate. In one embodiment, the core structure 102 includes a polycrystalline p-type or n-type silicon substrate. In another embodiment, the core structure 102 includes a p-type or an n-type silicon solar substrate. The substrate utilized to form the core structure 102 may further have a polygonal or circular shape. For example, the core structure 102 may include a substantially square silicon substrate having lateral dimensions between about 120 mm and about 180 mm, with or without chamfered edges. In another example, the core structure 102 may include a circular silicon-containing wafer having a diameter between about 20 mm and about 700 mm, such as between about 100 mm and about 50 mm, for example about 300 mm.

The core structure 102 has a thickness $T_1$ between about 50 µm and about 1000 µm, such as a thickness $T_1$ between about 70 µm and about 800 µm. For example, the core structure 102 has a thickness $T_1$ between about 80 µm and about 400 µm, such as a thickness $T_1$ between about 100 µm and about 200 µm. In another example, the core structure 102 has a thickness $T_1$ between about 70 µm and about 150 µm, such as a thickness $T_1$ between about 100 µm and about 130 µm. In another example, the core structure 102 has a thickness $T_1$ between about 700 µm and about 800 µm, such as a thickness $T_1$ between about 725 µm and about 775 µm.

The core structure 102 further includes one or more holes or core vias 103 (hereinafter referred to as "core vias") formed therein to enable conductive electrical interconnections to be routed through the core structure 102. Generally, the one or more core vias 103 are substantially cylindrical in shape. However, other suitable morphologies for the core vias 103 are also contemplated. The core vias 103 may be formed as singular and isolated core vias 103 through the core structure 102 or in one or more groupings or arrays. In one embodiment, a minimum pitch $P_1$ between each core via 103 is less than about 1000 µm, such as between about 25 µm and about 200 µm. For example, the pitch $P_1$ is between about 40 µm and about 150 µm. In one embodiment, the one or more core vias 103 have a diameter $V_1$ less than about 500 µm, such as a diameter $V_1$ less than about 250 µm. For example, the core vias 103 have a diameter $V_1$ between about 25 µm and about 100 µm, such as a diameter $V_1$ between about 30 µm and about 60 µm. In one embodiment, the core vias 103 have a diameter $V_1$ of about 40 µm.

The optional passivating layer 104 may be formed on one or more surfaces of the core structure 102, including a first surface 106, a second surface 108, and one or more sidewalls of the core vias 103. In one embodiment, the passivating layer 104 is formed on substantially all exterior surfaces of the core structure 102 such that the passivating layer 104 substantially surrounds the core structure 102. Thus, the passivating layer 104 provides a protective outer barrier for the core structure 102 against corrosion and other forms of damage. In one embodiment, the passivating layer 104 is formed of an oxide film or layer, such as a thermal oxide layer. In some examples, the passivating layer 104 has a thickness between about 100 nm and about 3 µm, such as a thickness between about 200 nm and about 2.5 µm. In one example, the passivating layer 104 has a thickness between about 300 nm and about 2 µm, such as a thickness of about 1.5 µm.

The insulating layer 118 is formed on one or more surfaces of the core structure 102 or the passivating layer 104 and may substantially encase the passivating layer 104 and/or the core structure 102. Thus, the insulating layer 118 may extend into the core vias 103 and coat the passivating layer 104 formed on the sidewalls thereof or directly coat the core structure 102, thus defining the diameter $V_2$ as depicted in FIG. 1A. In one embodiment, the insulating layer 118 has a thickness $T_2$ from an outer surface of the core structure 102 or the passivating layer 104 to an adjacent outer surface of the insulating layer 118 (e.g., major surfaces 105, 107) that is less than about 50 µm, such as a thickness $T_2$ less than about 20 µm. For example, the insulating layer 118 has thickness $T_2$ between about 5 µm and about 10 µm.

In one embodiment, the insulating layer 118 is formed of polymer-based dielectric materials. For example, the insulating layer 118 is formed from a flowable build-up material. Accordingly, although hereinafter referred to as an "insulating layer," the insulating layer 118 may also be described as a dielectric layer. In a further embodiment, the insulating layer 118 is formed of an epoxy resin material having a ceramic filler, such as silica ($SiO_2$) particles. Other examples of ceramic fillers that may be utilized to form the insulating layer 118 include aluminum nitride (AlN), aluminum oxide ($Al_2O_3$), silicon carbide (SiC), silicon nitride ($Si_3N_4$, $Sr_2Ce_2Ti_5O_{16}$), zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the insulating layer 118 have particles ranging in size between about 40 nm and about 1.5 µm, such as between about 80 nm and about 1 µm. For example, the ceramic fillers have particles ranging in size between about 200 nm and about 800 nm, such as between about 300 nm and about 600 nm. In some embodiments, the ceramic fillers include particles having a size less than about 10% of the width or diameter of adjacent core vias 103 in the core structure 102, such as a size less than about 5% of the width or diameter of the core vias 103.

One or more through-assembly holes or vias 113 (hereinafter referred to as "through-assembly vias") are formed through the insulating layer 118 where the insulating layer 118 extends into the core vias 103. For example, the through-assembly vias 113 may be centrally formed within the core vias 103 having the insulating layer 118 disposed therein. Accordingly, the insulating layer 118 forms one or more sidewalls of the through-assembly vias 113, wherein the through-assembly vias 113 have a diameter $V_2$ lesser than the diameter $V_1$ of the core vias 103. In one embodiment, the through-assembly vias 113 have a diameter $V_2$ less than about 100 µm, such as less than about 75 µm. For example, the through-assembly vias 113 have a diameter $V_2$ less than about 50 µm, such as less than about 35 µm. In one embodiment, the through-assembly vias 113 have a diameter of between about 25 µm and about 50 µm, such as a diameter of between about 35 µm and about 40 µm.

The through-assembly vias 113 provide channels through which one or more electrical interconnections 144 are formed in the semiconductor core assembly 100. In one embodiment, the electrical interconnections 144 are formed through the entire thickness of the semiconductor core assembly 100 (i.e. from a first major surface 105 to a second major surface 107 of the semiconductor core assembly 100). For example, the electrical interconnections 144 may have a longitudinal length corresponding to a total thickness of the semiconductor core assembly 100 between about 50 µm and about 1000 µm, such as a longitudinal length between about 200 µm and about 800 µm. In one example, the electrical interconnections 144 have a longitudinal length of between about 400 µm and about 600 µm, such as longitudinal length of about 500 µm. In another embodiment, the electrical interconnections 144 are only formed through a portion of the thickness of the semiconductor core assembly 100. In further embodiments, the electrical interconnections 144 may protrude from a major surface of the semiconductor core assembly 100, such as the major surfaces 105, 107 as depicted in FIG. 1A. The electrical interconnections 144 may be formed of any conductive materials used in the field of integrated circuits, circuit boards, chip carriers, and the like. For example, the electrical interconnections 144 are formed of a metallic material, such as copper, aluminum, gold, nickel, silver, palladium, tin, or the like.

In the embodiment depicted in FIG. 1A, the electrical interconnections 144 have a lateral thickness equal to the diameter $V_2$ of the through-assembly vias 113 in which they are formed. In another embodiment, such as depicted in FIG. 1B, the semiconductor core assembly 100 further includes an adhesion layer 140 and/or a seed layer 142 formed thereon for electrical isolation of the electrical interconnections 144. In one embodiment, the adhesion layer 140 is formed on surfaces of the insulating layer 118 adjacent to the electrical interconnections 144, including the sidewalls of the through-assembly vias 113. Thus, as depicted in FIG. 1B, the electrical interconnections 144 have a lateral thickness less than the diameter $V_2$ of the through-assembly vias 113 in which they are formed. In yet another embodiment, the electrical interconnections 144 only cover the surfaces of the sidewalls of the through-assembly vias 113, and thus may have a hollow core therethrough.

The adhesion layer 140 may be formed of any suitable materials, including but not limited to titanium, titanium nitride, tantalum, tantalum nitride, manganese, manganese oxide, molybdenum, cobalt oxide, cobalt nitride, and the like. In one embodiment, the adhesion layer 140 has a thickness $B_1$ between about 10 nm and about 300 nm, such as between about 50 nm and about 150 nm. For example, the adhesion layer 140 has a thickness $B_1$ between about 75 nm and about 125 nm, such as about 100 nm.

The optional seed layer 142 comprises a conductive material, including but not limited to copper, tungsten, aluminum, silver, gold, or any other suitable materials or combinations thereof. The seed layer 142 may be formed on the adhesion layer 140 or directly on the sidewalls of the through-assembly vias 113 (e.g., on the insulating layer 118 without an adhesion layer therebetween). In one embodiment, the seed layer 142 has a thickness between about 50 nm and about 500 nm, such as between about 100 nm and about 300 nm. For example, the seed layer 142 has a thickness between about 150 nm and about 250 nm, such as about 200 nm.

In some embodiments, such as depicted in FIG. 1B, the semiconductor core assembly 100 further includes one or more redistribution layers 150 formed on a first side 175 and/or a second side 177 of the semiconductor core assembly 100 (the redistribution layer 150 is depicted as being formed on the second side 177 in FIG. 1B). In one embodiment, the redistribution layer 150 is formed of substantially the same materials as the insulating layer 118 (e.g., polymer-based dielectric materials), and thus forms an extension thereof. In other embodiments, the redistribution layer 150 is formed of a different material than the insulating layer 118. For example, the redistribution layer 150 may be formed of a photodefinable polyimide material, a non-photosensitive polyimide, polybenzoxazole (PBO), benzocyclobutene (BCB), silicon dioxide, and/or silicon nitride. In another example, the redistribution layer 150 is formed from a different inorganic dielectric material than the insulating layer 118. In one embodiment, the redistribution layer 150 has a thickness between about 5 μm and about 50 μm, such as a thickness between about 10 μm and about 40 μm. For example, the redistribution layer 150 has a thickness between about 20 μm and about 30 μm, such as about 25 μm.

The redistribution layer 150 may include one or more redistribution connections 154 formed through redistribution vias 153 for relocating contact points of the electrical interconnections 144 to desired locations on the surfaces of the semiconductor core assembly 100, such as the major surfaces 105, 107. In some embodiments, the redistribution layer 150 may further include one or more external electrical connections (not shown) formed on the major surfaces 105, 107, such as a ball grid array or solder balls. Generally, the redistribution vias 153 and the redistribution connections 154 have substantially similar or smaller lateral dimensions relative to the through-assembly vias 113 and the electrical interconnections 144, respectively. For example, the redistribution vias 153 have a diameter $V_3$ between about 2 μm and about 50 μm, such as a diameter $V_3$ between about 10 μm and about 40 μm, such as a diameter $V_3$ between about 20 μm and about 30 μm. Furthermore, the redistribution layer 150 may include the adhesion layer 140 and the seed layer 142 formed on surfaces adjacent to the redistribution connections 154, including sidewalls of the redistribution vias 153.

Figure 2:
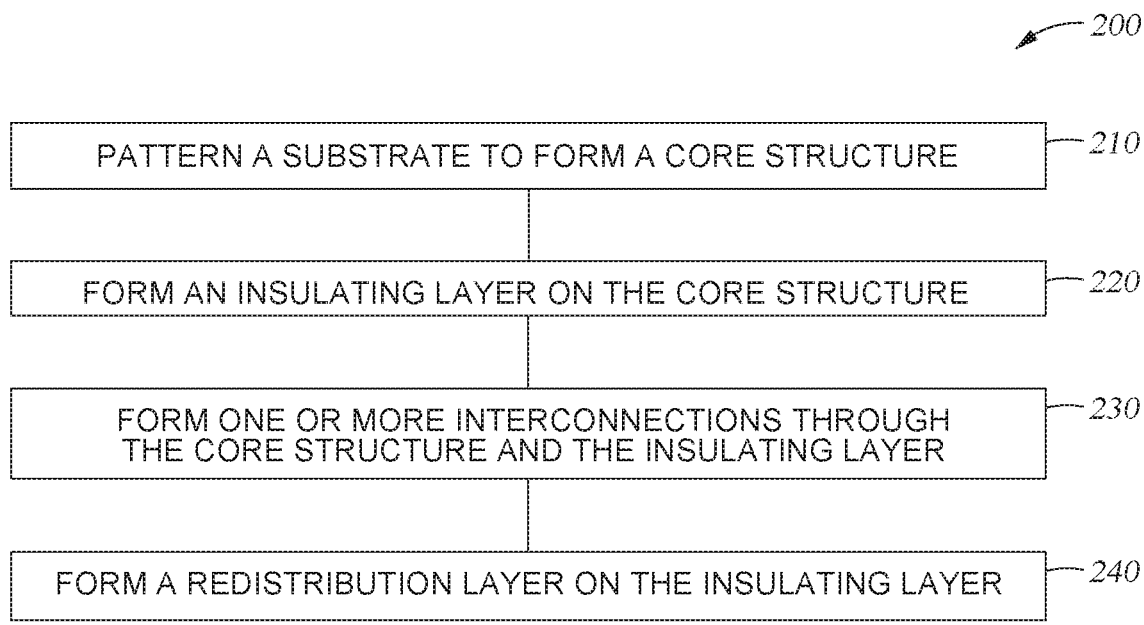
FIG. 2 is a flow diagram that illustrates a process for forming the semiconductor core assemblies of FIGS. 1A and 1B, according to an embodiment described herein.

FIG. 2 illustrates a flow diagram of a representative method 200 of forming a semiconductor core assembly. The method 200 has multiple operations 210, 220, 230, and 240. Each operation is described in greater detail with reference to FIGS. 3-12L. The method may include one or more additional operations which are carried out before any of the defined operations, between two of the define operations, or after all the defined operations (except where the context excludes the possibility).

In general, the method 200 includes structuring a substrate to be utilized as a core structure (e.g., frame) at operation 210, further described in greater detail with reference to FIGS. 3 and 4A-4D. At operation 220, an insulating layer is formed on the core structure 102, further described in greater detail with reference to FIGS. 5, 6A-6I, 7, and 8A-8E. At operation 230, one or more interconnections are formed through the core structure 102 and the insulating layer, further described in greater detail with reference to FIGS. 9 and 10A-10H. At operation 240, a redistribution layer is formed on the insulating layer to relocate contact points of the interconnections to desired locations on a surface of an assembled core assembly and the core assembly is thereafter singulated. In some embodiments, one or more additional redistribution layers may be formed in addition to the first redistribution layer, described in greater detail with reference to FIGS. 11 and 12A-12L.

Figure 3:
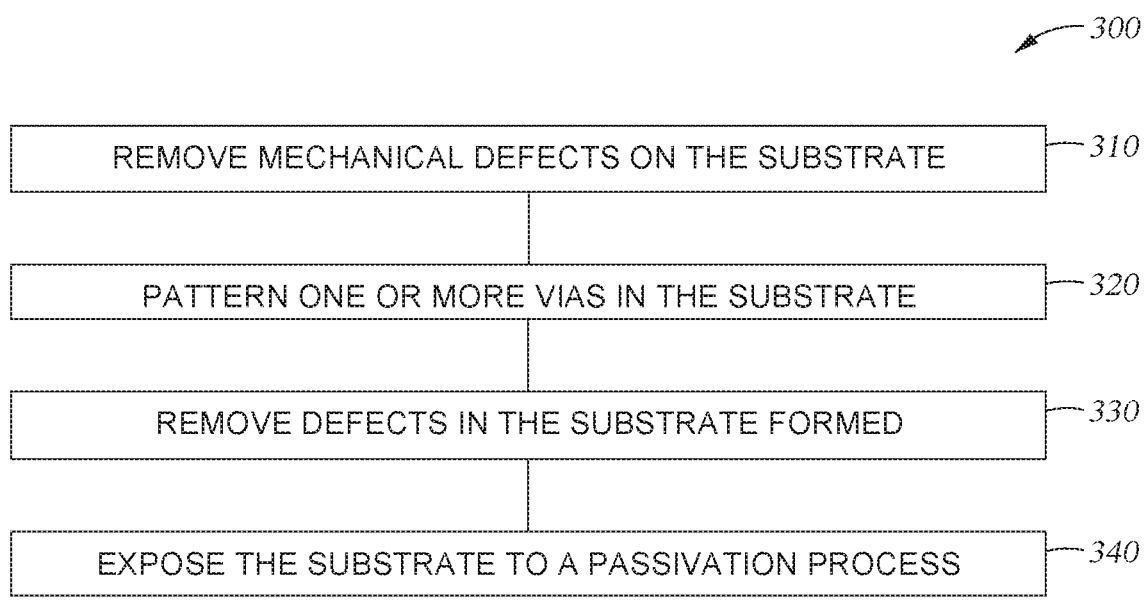
FIG. 3 is a flow diagram that illustrates of a process for structuring a substrate for a semiconductor core assembly, according to an embodiment described herein.

FIG. 3 illustrates a flow diagram of a representative method 300 for structuring a substrate 400 to be utilized as a core structure. FIGS. 4A-4D schematically illustrate cross-sectional views of a substrate 400 at various stages of the substrate structuring process 300 represented in FIG. 3. Therefore, FIG. 3 and FIGS. 4A-4D are herein described together for clarity.

Figure 4A:
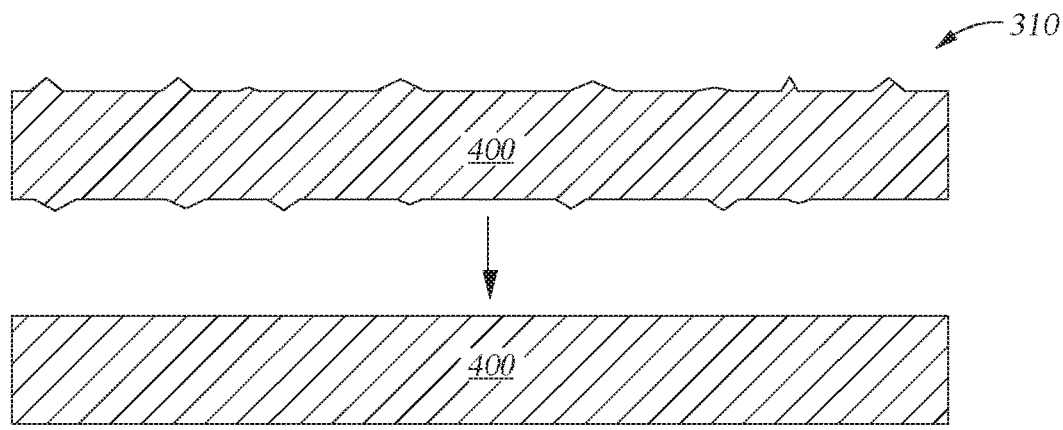
FIGS. 4A-4D schematically illustrate cross-sectional views of a substrate at different stages of the process depicted in FIG. 3, according to an embodiment described herein.

The method 300 begins at operation 310 and corresponding FIG. 4A. As described with reference to the core structure 102 above, the substrate 400 is formed of any suitable substrate material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, glass material (e.g., borosilicate glass), sapphire, alumina, and/or ceramic material. In one embodiment, the substrate 400 is a monocrystalline p-type or n-type silicon substrate. In one embodiment, the substrate 400 is a multicrystalline p-type or n-type silicon substrate. In another embodiment, the substrate 400 is a p-type or an n-type silicon solar substrate.

The substrate 400 may further have a polygonal or circular shape. For example, the substrate 400 may include a substantially square silicon substrate having lateral dimensions between about 140 mm and about 180 mm, with or without chamfered edges. In another example, the substrate 400 may include a circular silicon containing wafer having a diameter between about 20 mm and about 700 mm, such as between about 100 mm and about 500 mm, for example about 300 mm. Unless otherwise noted, embodiments and examples described herein are conducted on substrates having a thickness between about 50 μm and about 1000 μm, such as a thickness between about 90 μm and about 780 μm. For example, the substrate 400 has a thickness between about 100 μm and about 300 μm, such as a thickness between about 110 μm and about 200 μm.

Prior to operation 310, the substrate 400 may be sliced and separated from a bulk material by wire sawing, scribing and breaking, mechanical abrasive sawing, or laser cutting. Slicing typically causes mechanical defects or deformities in substrate surfaces formed therefrom, such as scratches, micro-cracking, chipping, and other mechanical defects. Thus, the substrate 400 is exposed to a first damage removal process at operation 310 to smoothen and planarize surfaces thereof and remove mechanical defects in preparation for later structuring operations. In some embodiments, the substrate 400 may further be thinned by adjusting the process parameters of the first damage process. For example, a thickness of the substrate 400 may be decreased with increased exposure to the first damage removal process.

The first damage removal process at operation 310 includes exposing the substrate 400 to a substrate polishing process and/or an etch process followed by rinsing and drying processes. In some embodiments, operation 310 includes a chemical mechanical polishing (CMP) process. In one embodiment, the etch process is a wet etch process including a buffered etch process that is selective for the removal of a desired material (e.g., contaminants and other undesirable compounds). In other embodiments, the etch process is a wet etch process utilizing an isotropic aqueous etch process. Any suitable wet etchant or combination of wet etchants may be used for the wet etch process. In one embodiment, the substrate 400 is immersed in an aqueous HF etching solution for etching. In another embodiment, the substrate 400 is immersed in an aqueous KOH etching solution for etching.

In some embodiments, the etching solution is heated to a temperature between about 30° C. and about 100° C. during the etch process, such as between about 40° C. and 90° C. For example, the etching solution is heated to a temperature of about 70° C. In still other embodiments, the etch process at operation 310 is a dry etch process. An example of a dry etch process includes a plasma-based dry etch process. The thickness of the substrate 400 is modulated by controlling the time of exposure of the substrate 400 to the etchants (e.g., etching solution) utilized during the etch process. For example, a final thickness of the substrate 400 is reduced with increased exposure to the etchants. Alternatively, the substrate 400 may have a greater final thickness with decreased exposure to the etchants.

Figure 4B:
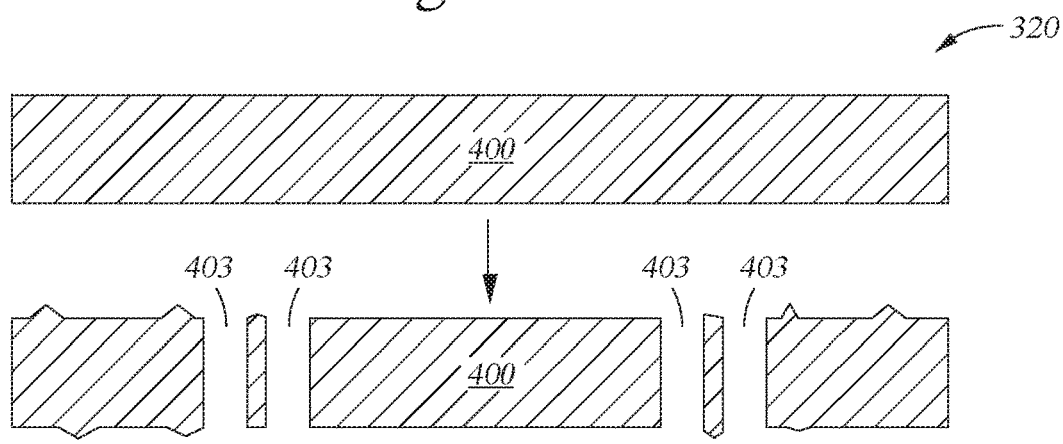
Figure 4C:
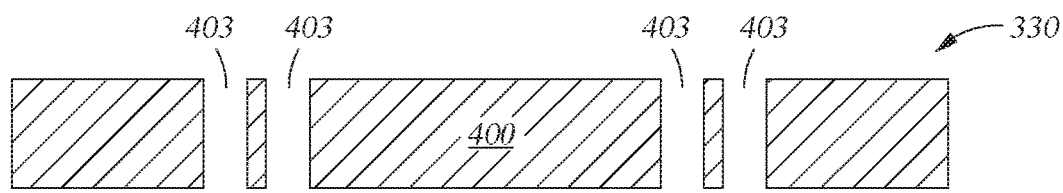

At operation 320, the now planarized and substantially defect-free substrate 400 is patterned to form one or more core vias 403 therein (four core vias 403 are depicted in the cross-section of substrate 400 in FIG. 4B). The core vias 403 are utilized to form direct-contact electrical interconnections through the substrate 400.

Generally, the one or more core vias 403 may be formed by laser ablation (e.g. direct laser patterning). Any suitable laser ablation system may be utilized to form the one or more core vias 403. In some examples, the laser ablation system utilizes an infrared (IR) laser source. In some examples, the laser source is a picosecond ultraviolet (UV) laser. In other examples, the laser is a femtosecond UV laser. In still other examples, the laser source is a femtosecond green laser. The laser source of the laser ablation system generates a continuous or pulsed laser beam for patterning of the substrate 400. For example, the laser source may generate a pulsed laser beam having a frequency between 5 kHz and 500 kHz, such as between 10 kHz and about 200 kHz. In one example, the laser source is configured to deliver a pulsed laser beam at a wavelength between about 200 nm and about 1200 nm and a pulse duration between about 10 ns and about 5000 ns with an output power between about 10 Watts and about 100 Watts. The laser source is configured to form any desired pattern of features in the substrate 400, including the core vias 403.

In some embodiments, the substrate 400 is optionally coupled to a carrier plate (not shown) before being patterned. The optional carrier plate may provide mechanical support for the substrate 400 during patterning thereof and may prevent the substrate 400 from breaking. The carrier plate may be formed of any suitable chemically- and thermally-stable rigid material including but not limited to glass, ceramic, metal, or the like. In some examples, the carrier plate has a thickness between about 1 mm and about 10 mm, such as between about 2 mm and about 5 mm. In one embodiment, the carrier plate has a textured surface. In other embodiments, the carrier plate has a polished or smoothened surface. The substrate 400 may be coupled to the carrier plate utilizing any suitable temporary bonding material, including but not limited to wax, glue, or similar bonding material.

In some embodiments, patterning the substrate 400 may cause unwanted mechanical defects in the surfaces of the substrate 400, including chipping, cracking, and/or warping. Thus, after performing operation 320 to form the core vias 403 in the substrate 400, the substrate 400 is exposed to a second damage removal and cleaning process at operation 330 substantially similar to the first damage removal process at operation 310 to smoothen the surfaces of the substrate 400 and remove unwanted debris. As described above, the second damage removal process includes exposing the substrate 400 to a wet or dry etch process, followed by rinsing and drying thereof. The etch process proceeds for a predetermined duration to smoothen the surfaces of the substrate 400, and particularly the surfaces exposed to laser patterning operations. In another aspect, the etch process is utilized to remove any undesired debris remaining on the substrate 400 from the patterning process.

Figure 4D:
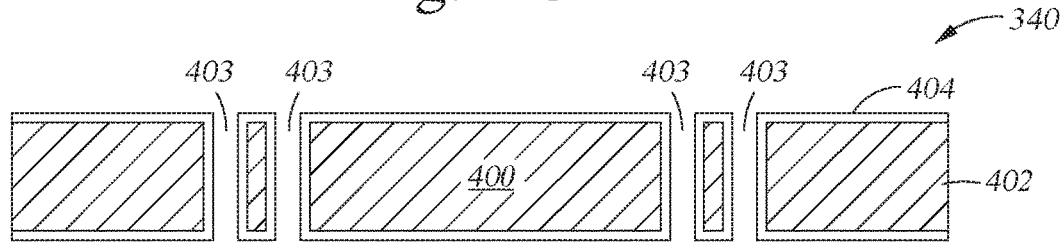
Figure 5:
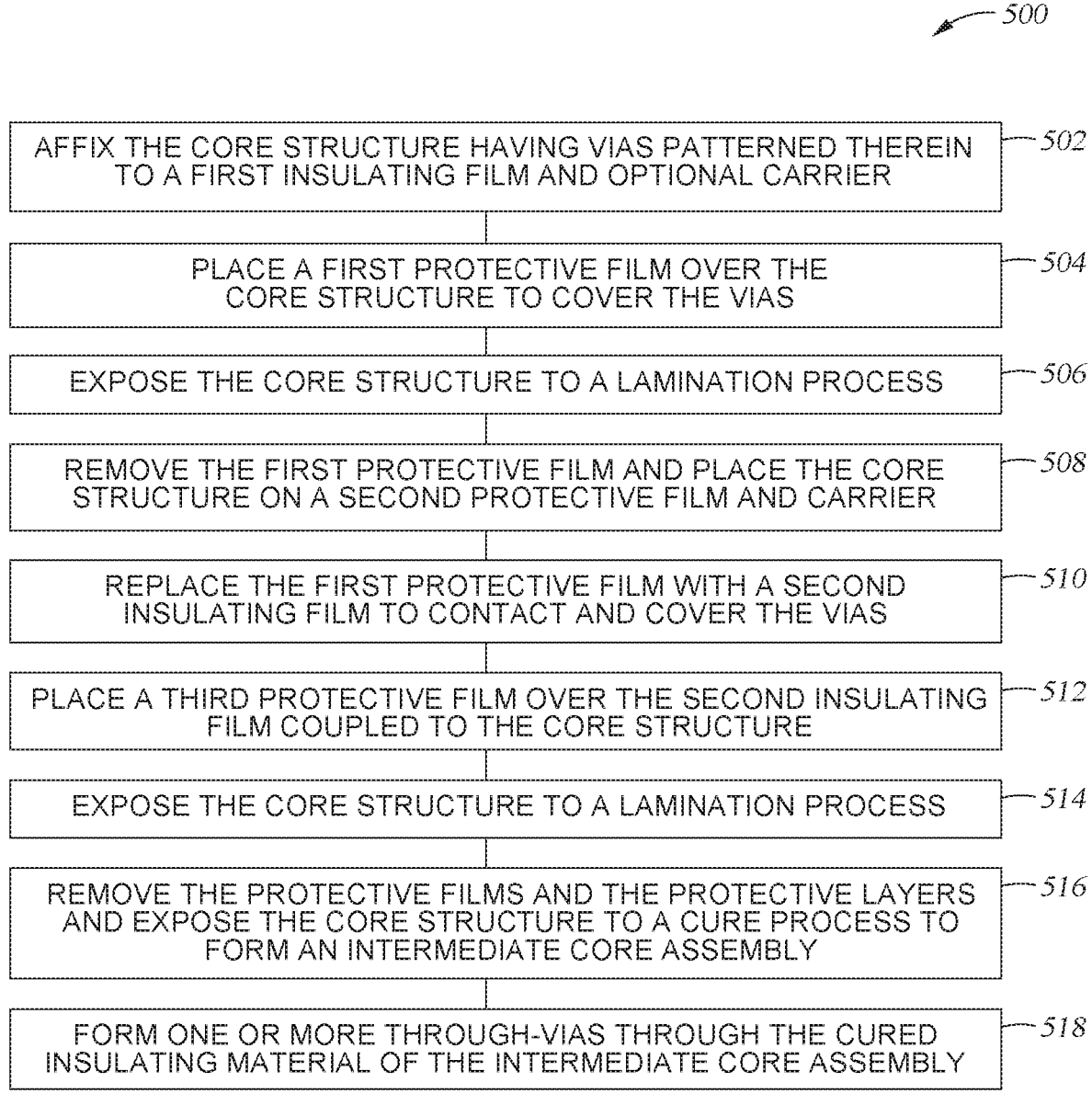
FIG. 5 is a flow diagram that illustrates a process for forming an insulating layer on a core structure for a semiconductor core assembly, according to an embodiment described herein.

After removal of mechanical defects in the substrate 400 at operation 330, the substrate 400 is exposed to a passivation process at operation 340 and FIG. 4D to grow or deposit a passivating film or layer, such as oxide layer 404, on desired surfaces thereof (e.g., all surfaces of the substrate 400). In one embodiment, the passivation process is a thermal oxidation process. The thermal oxidation process is performed at a temperature between about 800° C. and about 1200° C., such as between about 850° C. and about 1150° C. For example, the thermal oxidation process is performed at a temperature between about 900° C. and about 1100° C., such as a temperature between about 950° C. and about 1050° C. In one embodiment, the thermal oxidation process is a wet oxidation process utilizing water vapor as an oxidant. In one embodiment, the thermal oxidation process is a dry oxidation process utilizing molecular oxygen as the oxidant. It is contemplated that the substrate 400 may be exposed to any suitable passivation process at operation 340 to form the oxide layer 404 or any other suitable passivating layer thereon. The resulting oxide layer 404 generally has a thickness between about 100 nm and about 3 µm, such as between about 200 nm and about 2.5 µm. For example, the oxide layer 404 has a thickness between about 300 nm and about 2 µm, such as about 1.5 µm Upon passivation, the substrate 400 is ready to be utilized as a core structure 402 for the formation of a core assembly, such as the semiconductor core assembly 100. FIGS. 5 and 7 illustrate flow diagrams of representative methods 500 and 700, respectively, for forming an insulating layer 618 on the core structure 402. FIGS. 6A-6I schematically illustrate cross-sectional views of the core structure 402 at different stages of the method 500 depicted in FIG. 5, and FIGS. 8A-8E schematically illustrate cross-sectional views of the core structure 402 at different stages of the method 700 depicted in FIG. 7. For clarity, FIG. 5 and FIGS. 6A-6I are herein described together and FIG. 7 and FIGS. 8A-8E are herein described together.

Figure 6A:
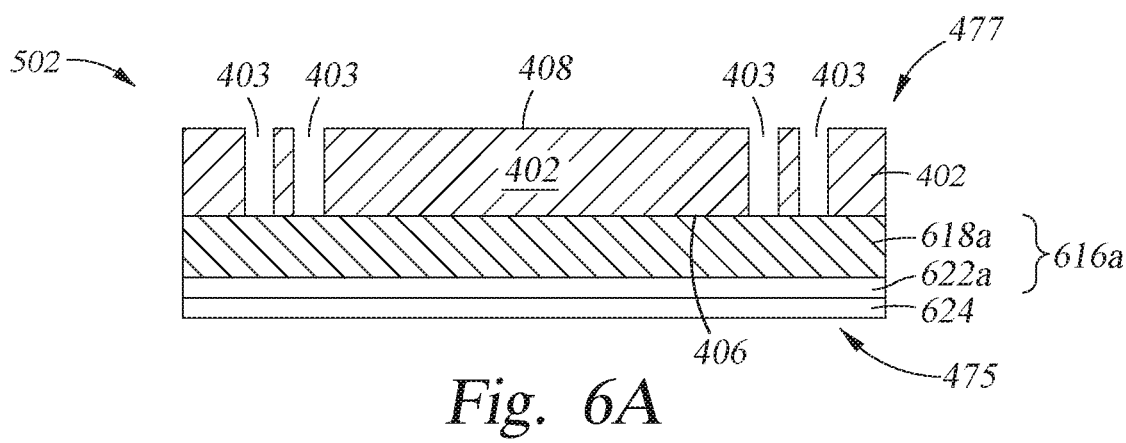
FIGS. 6A-6I schematically illustrate cross-sectional views of a core structure at different stages of the process depicted in FIG. 5, according to an embodiment described herein.
Figure 7:
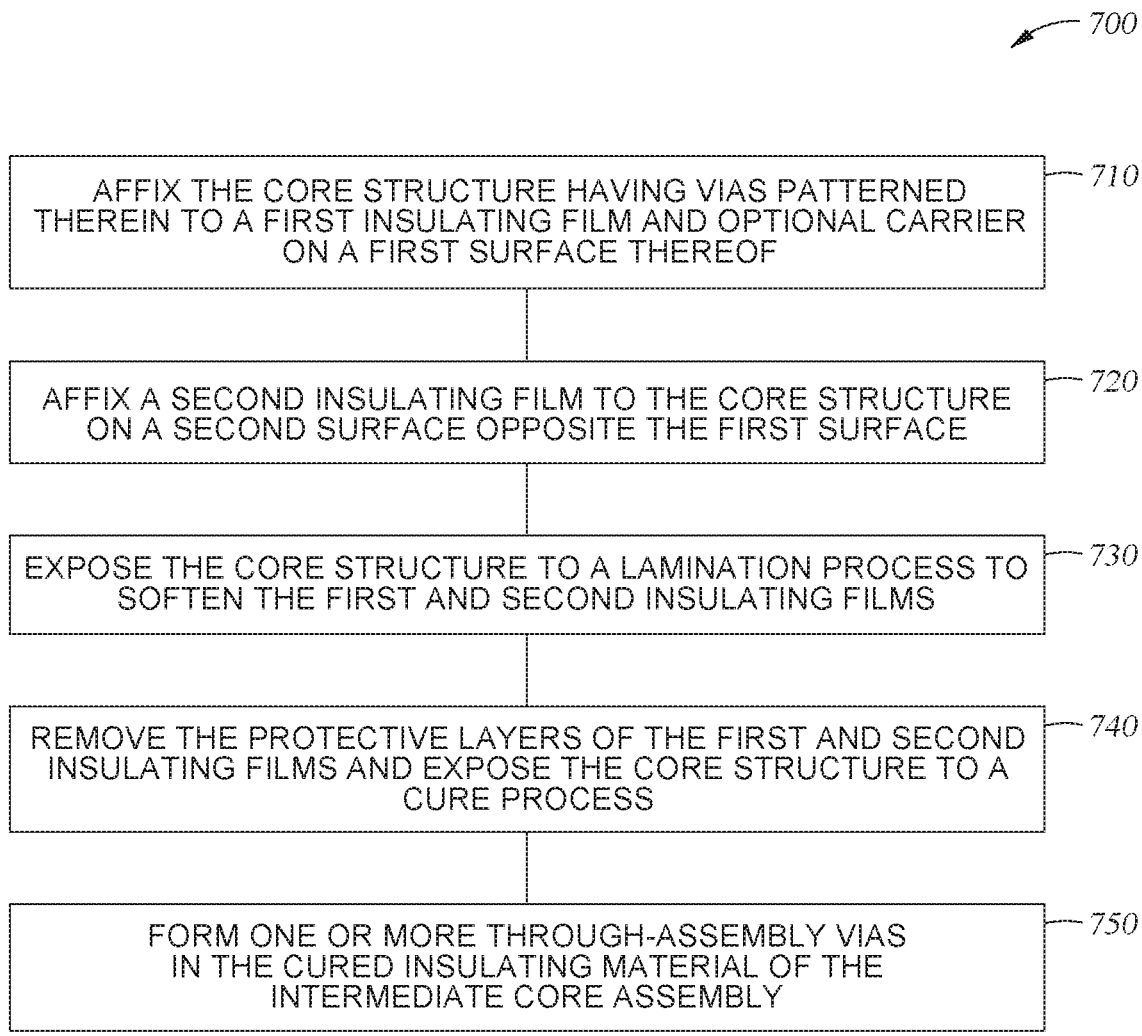
FIG. 7 is a flow diagram that illustrates a process for forming an insulating layer on a core structure for a semiconductor core assembly, according to an embodiment described herein.

Generally, the method 500 begins at operation 502 and FIG. 6A wherein a first surface 406 of the core structure 402 at a first side 475, now having the core vias 403 formed therein and the oxide layer 404 formed thereon, is placed on and affixed to a first insulating film 616a. In one embodiment, the first insulating film 616a includes one or more layers formed of polymer-based dielectric materials. For example, the first insulating film 616a includes one or more layers formed of flowable build-up materials. In one embodiment, the first insulating film 616a includes a flowable epoxy resin layer 618a. Generally, the epoxy resin layer 618a has a thickness less than about 60 µm, such as between about 5 µm and about 50 µm. For example, the epoxy resin layer 618a has a thickness between about 10 µm and about 25 µm.

The epoxy resin layer 618a may be formed of a ceramic-filler-containing epoxy resin, such as an epoxy resin filled with (e.g., containing) silica ($SiO_2$) particles. Other examples of ceramic fillers that may be used to form the epoxy resin layer 618a and other layers of the insulating film 616a include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the epoxy resin layer 618a have particles ranging in size between about 40 nm and about 1.5 µm, such as between about 80 nm and about 1 µm. For example, the ceramic fillers utilized to form the epoxy resin layer 618a have particles ranging in size between about 200 nm and about 800 nm, such as between about 300 nm and about 600 nm.

In some embodiments, the first insulating film 616a further includes one or more protective layers. For example, the first insulating film 616a includes a polyethylene terephthalate (PET) protective layer 622a, such as a biaxial PET protective layer 622a. However, any suitable number and combination of layers and materials is contemplated for the first insulating film 616a. In some embodiments, the entire insulating film 616a has a thickness less than about 120 µm, such as a thickness less than about 90 µm.

In some embodiments, after affixing the core structure 402 to the first insulating film 616a, the core structure 402 may then be placed on a carrier 624 adjacent the first side 475 thereof for additional mechanical stabilization during later processing operations. Generally, the carrier 624 is formed of any suitable mechanically and thermally stable material capable of withstanding temperatures above 100° C. For example, in one embodiment the carrier 624 comprises polytetrafluoroethylene (PTFE). In another example, the carrier 624 is formed of polyethylene terephthalate (PET).

Figure 6B:
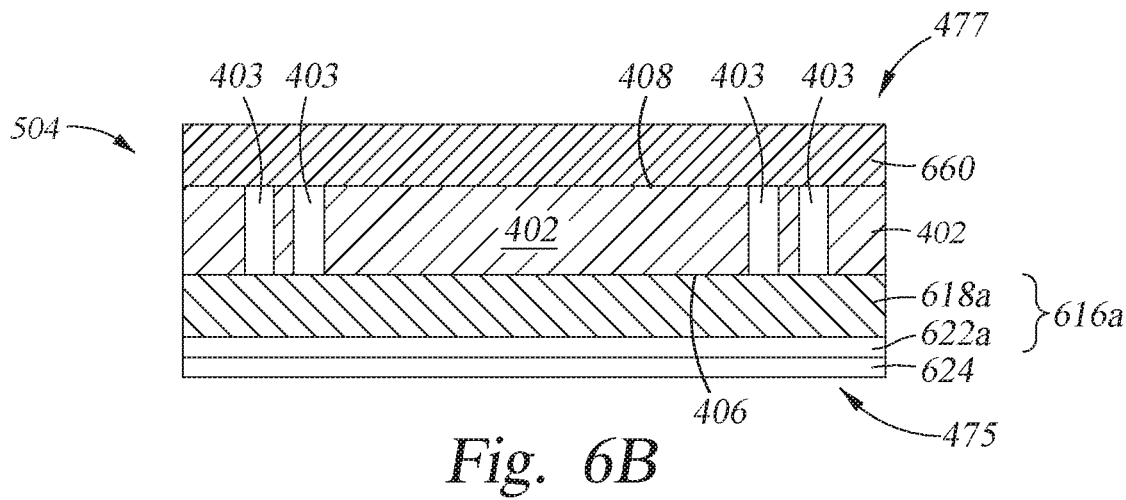

At operation 504 and FIG. 6B, a first protective film 660 is affixed to a second surface 408 on a second side 477 of the core structure 402. The protective film 660 is coupled to the core structure 402 on the second side 477 and opposite of the first insulating film 616a such that it covers the core vias 403. In one embodiment, the protective film 660 is formed of a material similar to that of the protective layer 622a. For example, the protective film 660 is formed of PET, such as biaxial PET. However, the protective film 660 may be formed of any suitable protective materials. In some embodiments, the protective film 660 has a thickness between about 50 µm and about 150 µm.

Figure 6C:
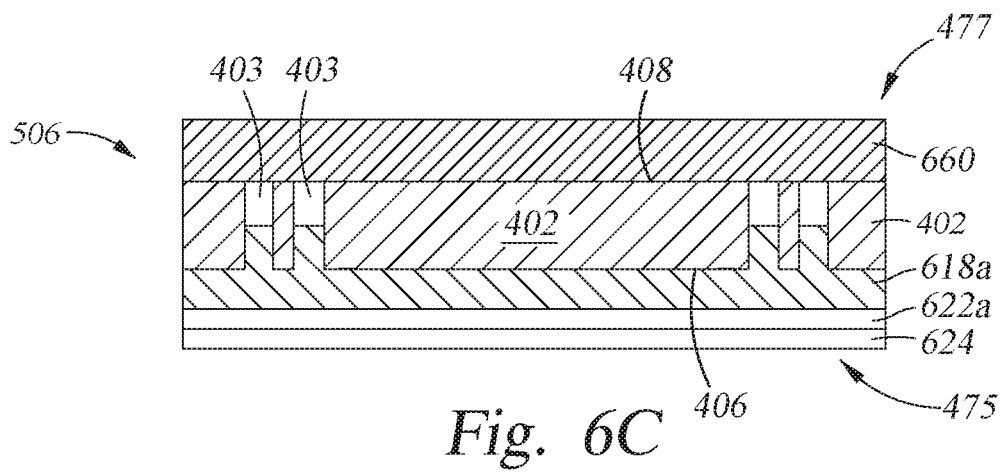

The core structure 402, now affixed to the insulating film 616a at the first side 475 and the protective film 660 at the second side 477, is exposed to a first lamination process at operation 506. During the lamination process, the core structure 402 is exposed to elevated temperatures, causing the epoxy resin layer 618a of the insulating film 616a to soften and flow into the open voids or volumes between the insulating film 616a and the protective film 660, such as into the core vias 403. Accordingly, the core vias 403 become at least partially filled (e.g., occupied) with the insulating material of the epoxy resin layer 618a, as depicted in FIG. 6C. Further, the core structure 402 becomes partially surrounded by the insulating material of the epoxy resin layer 618a.

In one embodiment, the lamination process is a vacuum lamination process that may be performed in an autoclave or other suitable device. In one embodiment, the lamination process is performed by use of a hot pressing process. In one embodiment, the lamination process is performed at a temperature between about 80° C. and about 140° C. and for a period between about 1 minute and about 30 minutes. In some embodiments, the lamination process includes the application of a pressure between about 1 psig and about 150 psig while a temperature between about 80° C. and about 140° C. is applied to core structure 402 and insulating film 616a for a period between about 1 minute and about 30 minutes. For example, the lamination process is performed by applying a pressure between about 10 psig and about 100 psig, and a temperature between about 100° C. and about 120° C. for a period between about 2 minutes and 10 minutes. For example, the lamination process is performed at a temperature of about 110° C. for a period of about 5 minutes.

Figure 6D:
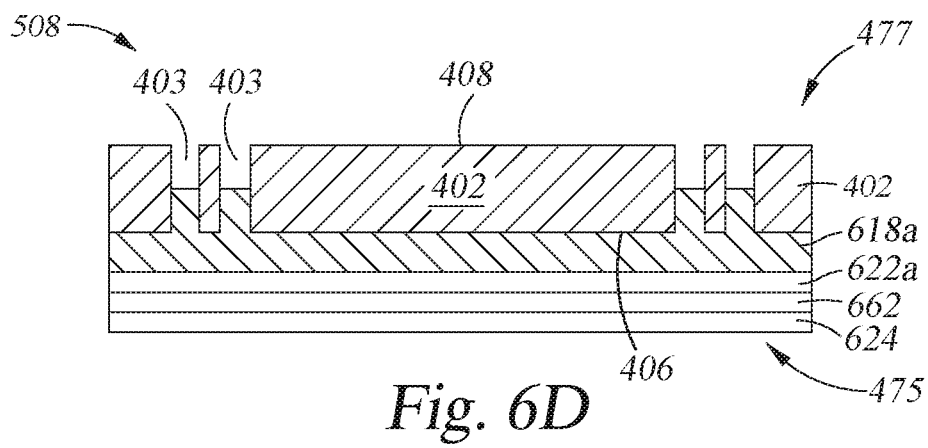

At operation 508, the protective film 660 is removed and the core structure 402, now having the laminated insulating material of the epoxy resin layer 618a at least partially surrounding the core structure 402 and partially filling the core vias 403, is placed on a second protective film 662. As depicted in FIG. 6D, the second protective film 662 is coupled to the core structure 402 adjacent the first side 475 such that the second protective film 662 is disposed against (e.g., adjacent) the protective layer 622a of the insulating film 616a. In some embodiments, the core structure 402, now coupled to the protective film 662, may be optionally placed on the carrier 624 for additional mechanical support on the first side 475. In some embodiments, the protective film 662 is placed on the carrier 624 prior to coupling the protective film 662 with the core structure 402. Generally, the protective film 662 is substantially similar in composition to the protective film 660. For example, the protective film 662 may be formed of PET, such as biaxial PET. However, the protective film 662 may be formed of any suitable protective materials. In some embodiments, the protective film 662 has a thickness between about 50 µm and about 150 µm.

Figure 6E:
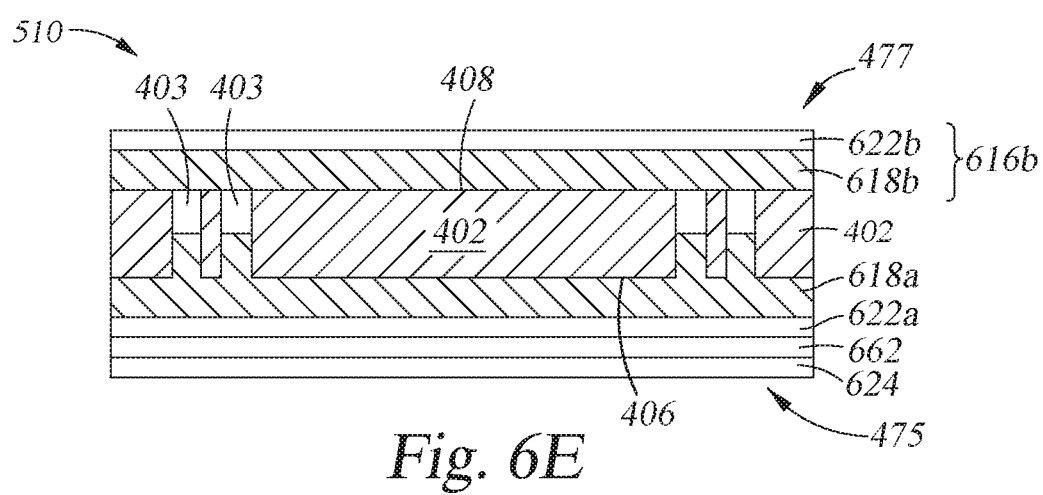

Upon coupling the core structure 402 to the second protective film 662, a second insulating film 616b substantially similar to the first insulating film 616a is placed over the second side 477 at operation 510 and FIG. 6E, thus replacing the protective film 660. In one embodiment, the second insulating film 616b is positioned on the second side 477 of the core structure 402 such that an epoxy resin layer 618b of the second insulating film 616b covers the core vias 403. In one embodiment, the placement of the second insulating film 616b on the core structure 402 may form one or more voids between the insulating film 616b and the already-laminated insulating material of the epoxy resin layer 618a that partially surrounds the core structure 402 and partially fills the core vias 403. The second insulating film 616b may include one or more layers formed of polymer-based dielectric materials similar to the insulating film 616a. As depicted in FIG. 6E, the second insulating film 616b includes an epoxy resin layer 618b substantially similar to the epoxy resin layer 618a described above. The second insulating film 616b may further include a protective layer 622b formed of similar materials to the protective layer 622a, such as PET.

Figure 6F:
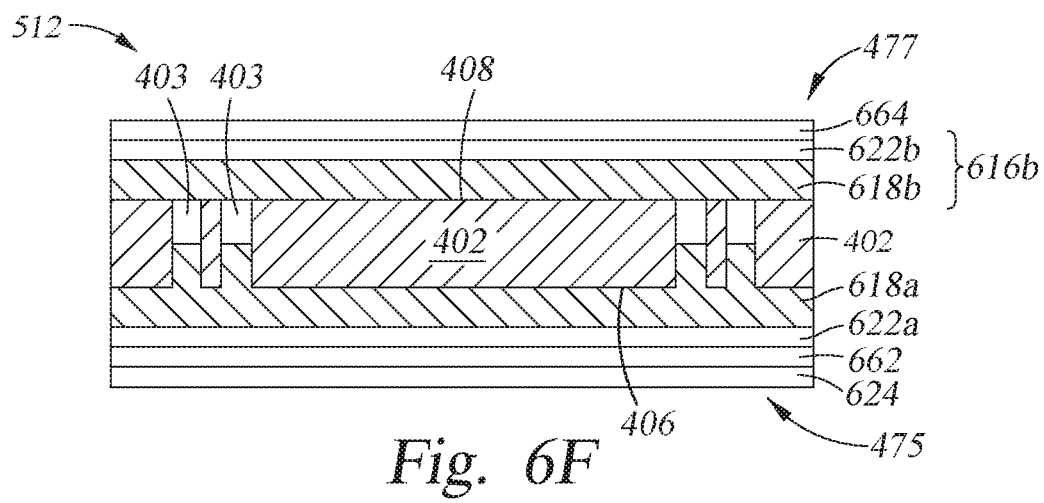

At operation 512, a third protective film 664 is placed over the second insulating film 616b, as depicted in FIG. 6F. Generally, the protective film 664 is substantially similar in composition to the protective films 660, 662. For example, the protective film 664 is formed of PET, such as biaxial PET. However, the protective film 664 may be formed of any suitable protective materials. In some embodiments, the protective film 664 has a thickness between about 50 μm and about 150 μm.

Figure 6G:
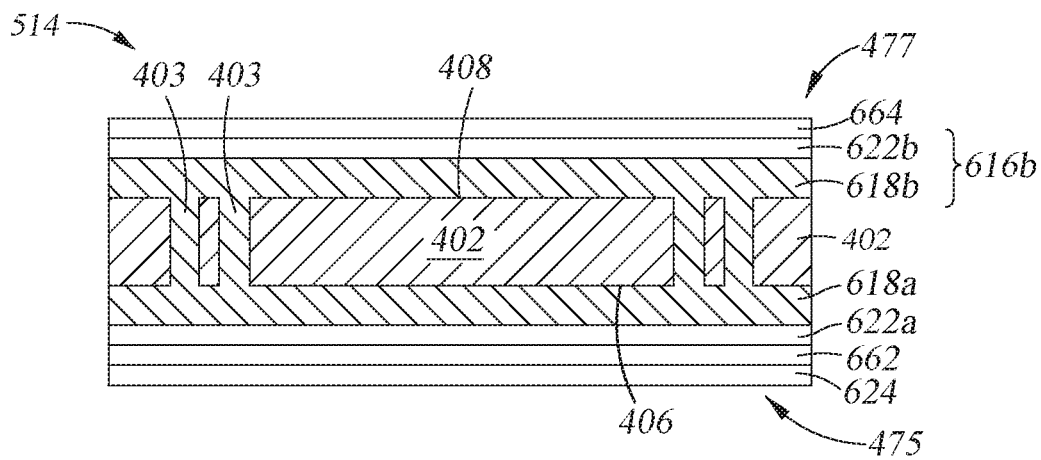

The core structure 402, now affixed to the insulating film 616b and the protective film 664 on the second side 477 and the protective film 662 and the optional carrier 624 on the first side 475, is exposed to a second lamination process at operation 514 and FIG. 6G. Similar to the lamination process at operation 504, the core structure 402 is exposed to elevated temperatures, causing the epoxy resin layer 618b of the insulating film 616b to soften and flow into any open voids or volumes between the insulating film 616b and the already-laminated insulating material of the epoxy resin layer 618a, thus integrating itself with the insulating material of the epoxy resin layer 618a. Accordingly, the core vias 403 become completely filled (e.g. packed, sealed) with insulating material of both epoxy resin layers 618a, 618b.

In one embodiment, the second lamination process is a vacuum lamination process that may be performed in an autoclave or other suitable device. In one embodiment, the lamination process is performed by use of a hot pressing process. In one embodiment, the lamination process is performed at a temperature between about 80° C. and about 140° C. and for a period between about 1 minute and about 30 minutes. In some embodiments, the lamination process includes the application of a pressure between about 1 psig and about 150 psig while a temperature between about 80° C. and about 140° C. is applied to the core structure 402 and the insulating film 616a for a period between about 1 minute and about 30 minutes. For example, the lamination process is performed by applying a pressure between about 10 psig and about 100 psig, and a temperature between about 100° C. and about 120° C. for a period between about 2 minutes and 10 minutes. For example, the lamination process is performed at a temperature of about 110° C. for a period of about 5 minutes.

Figure 6H:
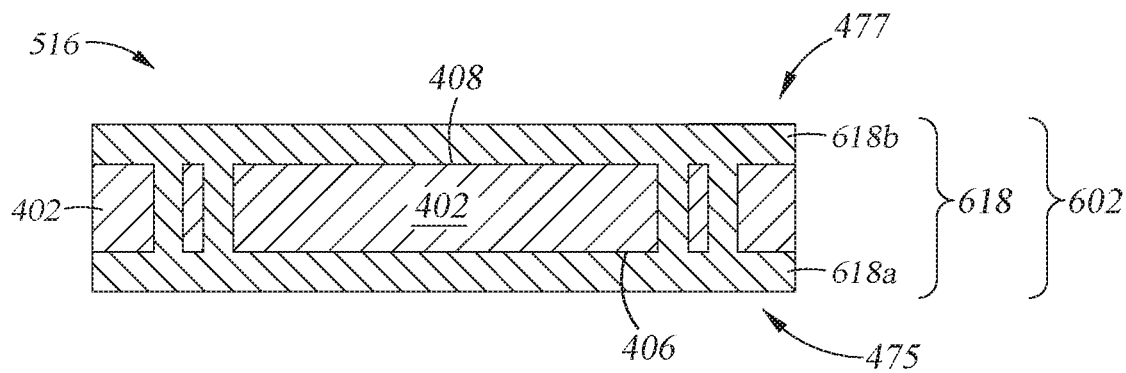
Figure 6I:
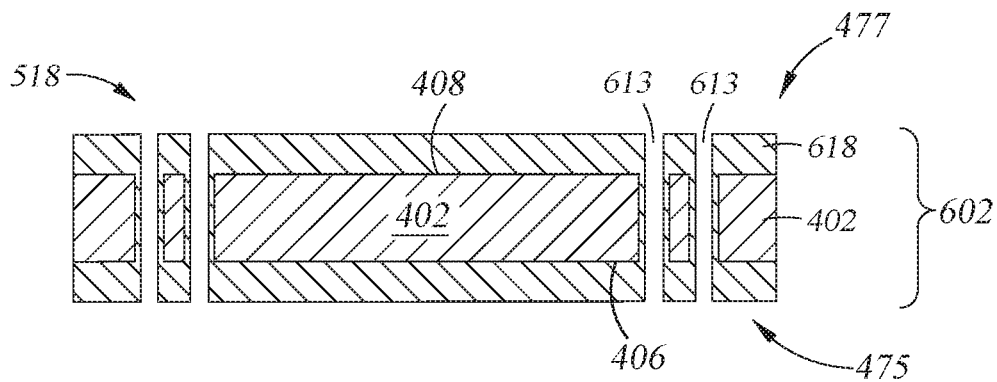

After lamination, the core structure 402 is disengaged from the carrier 624 at operation 516 and the protective films 662, 664 are removed, resulting in a laminated intermediate core assembly 602. As depicted in FIG. 6H, the intermediate core assembly 602 includes the core structure 402 having one or more core vias 403 formed therethrough and filled with the insulating dielectric material of the insulating films 616a, 616b. The insulating dielectric material of the epoxy resin layers 618a, 618b further encases the core structure 402 having the oxide layer 404 formed thereon such that the insulating material covers at least two surfaces or sides of the core structure 402 (e.g., surfaces 406, 408). In some examples, the protective layers 622a, 622b are also removed from the intermediate core assembly 602 at operation 516. Generally, the protective layers 622a and 622b, the carrier 624, and the protective films 662 and 664 are removed from the intermediate core assembly 602 by any suitable mechanical processes such as peeling therefrom.

Upon removal of the protective layers 622a, 622b and the protective films 662, 664, the intermediate core assembly 602 is exposed to a cure process to fully cure (i.e. harden through chemical reactions and cross-linking) the insulating dielectric material of the epoxy resin layers 618a, 618b, thus forming an insulating layer 618. The insulating layer 618 substantially surrounds the core structure 402 and fills the core vias 403. For example, the insulating layer 618 contacts or encapsulates at least the 107, 477 of the core structure 402 (including surfaces 406, 408).

In one embodiment, the cure process is performed at high temperatures to fully cure the intermediate core assembly 602. For example, the cure process is performed at a temperature between about 140° C. and about 220° C. and for a period between about 15 minutes and about 45 minutes, such as a temperature between about 160° C. and about 200° C. and for a period between about 25 minutes and about 35 minutes. For example, the cure process is performed at a temperature of about 180° C. for a period of about 30 minutes. In further embodiments, the cure process at operation 516 is performed at or near ambient (e.g. atmospheric) pressure conditions.

After curing, one or more through-assembly vias 613 are drilled through the intermediate core assembly 602 at operation 518, forming channels through the entire thickness of the intermediate core assembly 602 for subsequent interconnection formation. In some embodiments, the intermediate core assembly 602 may be placed on a carrier, such as the carrier 624, for mechanical support during the formation of the through-assembly vias 613. The through-assembly vias 613 are drilled through the core vias 403 that were formed in the core structure 402 and subsequently filled with the insulating layer 618. Thus, the through-assembly vias 613 may be circumferentially surrounded by the insulating layer 618 filled within the core vias 403. By having the ceramic-filler-containing epoxy resin material of the insulating layer 618 line the walls of the core vias 403, capacitive coupling between the conductive silicon-based core structure 402 and interconnections 1044 (described with reference to FIG. 9 and FIGS. 10A-10H) in the completed (e.g., final) semiconductor core assembly 1270 (described with reference to FIG. 11 and FIGS. 12K and 12L) is significantly reduced as compared to other conventional interconnecting structures that utilize conventional via-insulating liners or films. Furthermore, the flowable nature of the epoxy resin material of the insulating layer 618 enables more consistent and reliable encapsulation and insulation, thus enhancing electrical performance by minimizing leakage current of the completed semiconductor core assembly 1270.

In one embodiment, the through-assembly vias 613 have a diameter less than about 100 μm, such as less than about 75 μm. For example, the through-assembly vias 613 have a diameter less than about 50 μm, such as less than about 35 μm. In some embodiments, the through-assembly vias 613 have a diameter between about 25 μm and about 50 μm, such as a diameter between about 35 μm and about 40 μm. In one embodiment, the through assembly vias 613 are formed using any suitable mechanical process. For example, the through-assembly vias 613 are formed using a mechanical drilling process. In one embodiment, through-assembly vias 613 are formed through the intermediate core assembly 602 by laser ablation. For example, the through-assembly vias 613 are formed using an ultraviolet laser. In one embodiment, the laser source utilized for laser ablation has a frequency between about 5 kHz and about 500 kHz. In one embodiment, the laser source is configured to deliver a pulsed laser beam at a pulse duration between about 10 ns and about 100 ns with a pulse energy between about 50 microjoules (μJ) and about 500 μJ. Utilizing an epoxy resin material containing small ceramic filler particles further promotes more precise and accurate laser patterning of small-diameter vias, such as the through-assembly vias 613, as the small ceramic filler particles therein exhibit reduced laser light reflection, scattering, diffraction, and transmission of the laser light away from the area in which the via is to be formed during the laser ablation process.

In some embodiments, the through-assembly vias 613 are formed within (e.g., through) the core vias 403 in such a way that the remaining ceramic-filler-containing epoxy resin material (e.g., dielectric insulating material) on the sidewalls of the core vias 403 has an average thickness between about 1 µm and about 50 µm. For example, the remaining ceramic-filler-containing epoxy resin material on the sidewalls of the core vias 403 has an average thickness between about 5 µm and about 40 µm, such as between about 10 µm and about 30 µm. Accordingly, the resulting structure after formation of the through-assembly vias 613 may be described as a "via-in-via" (e.g., a via centrally formed in a dielectric material within a via of the core structure). The via-in-via structure includes a dielectric sidewall passivation consisting of a ceramic-particle-filled epoxy material and disposed on a thin layer of thermal oxide formed on the sidewalls of the core vias 403.

After formation of the through-assembly vias 613, the intermediate core assembly 602 is exposed to a de-smear process. During the de-smear process, any unwanted residues and/or debris caused by laser ablation during the formation of the through-assembly vias 613 are removed therefrom. The de-smear process thus cleans the through-assembly vias 613 for subsequent metallization. In one embodiment, the de-smear process is a wet de-smear process. Any suitable solvents, etchants, and/or combinations thereof may be utilized for the wet de-smear process. In one example, methanol may be utilized as a solvent and copper (II) chloride dihydrate ($CuCl_2.H_2O$) as an etchant. Depending on the residue thickness, exposure duration of the intermediate core assembly 602 to the wet de-smear process may be varied. In another embodiment, the de-smear process is a dry de-smear process. For example, the de-smear process may be a plasma de-smear process with an $O_2/CF_4$ mixture gas. The plasma de-smear process may include generating a plasma by applying a power of about 700 W and flowing $O_2:CF_4$ at a ratio of about 10:1 (e.g., 100:10 sccm) for a time period between about 60 seconds and about 120 seconds. In further embodiments, the de-smear process is a combination of wet and dry processes.

Following the de-smear process at operation 518, the intermediate core assembly 602 is ready for formation of interconnection paths therein, described below with reference to FIG. 9 and FIGS. 10A-10H.

As discussed above, FIG. 5 and FIGS. 6A-6I illustrate a representative method 500 for forming the intermediate core assembly 602. FIG. 7 and FIGS. 8A-8E illustrate an alternative method 700 substantially similar to the method 500 but with fewer operations. The method 700 generally includes five operations 710-750. However, operations 710, 740, and 750 of the method 700 are substantially similar to the operations 502, 516, and 518 of the method 500, respectively. Thus, only operations 720, 730, and 740, depicted in FIGS. 8B, 8C, and 8D, respectively, are herein described for clarity.

Figure 8A:
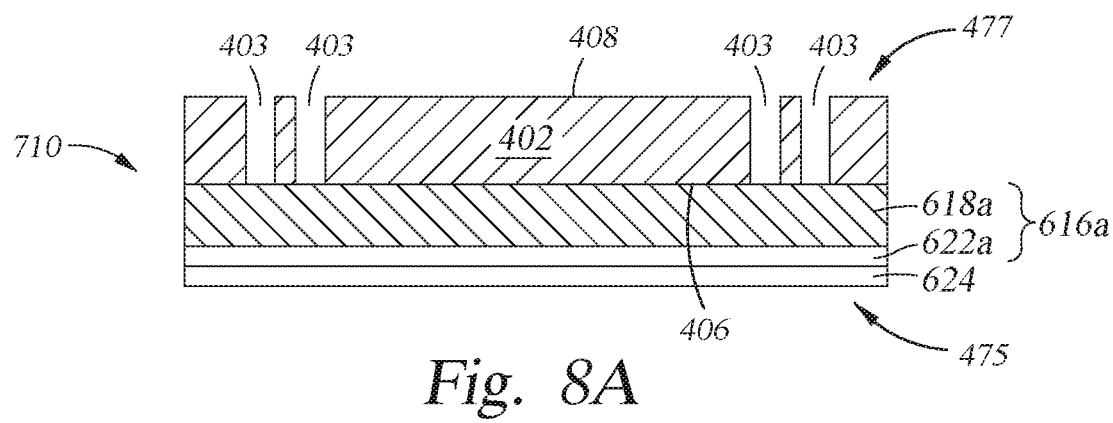
FIGS. 8A-8E schematically illustrate cross-sectional views of a core structure at different stages of the process depicted in FIG. 7, according to an embodiment described herein.
Figure 8B:
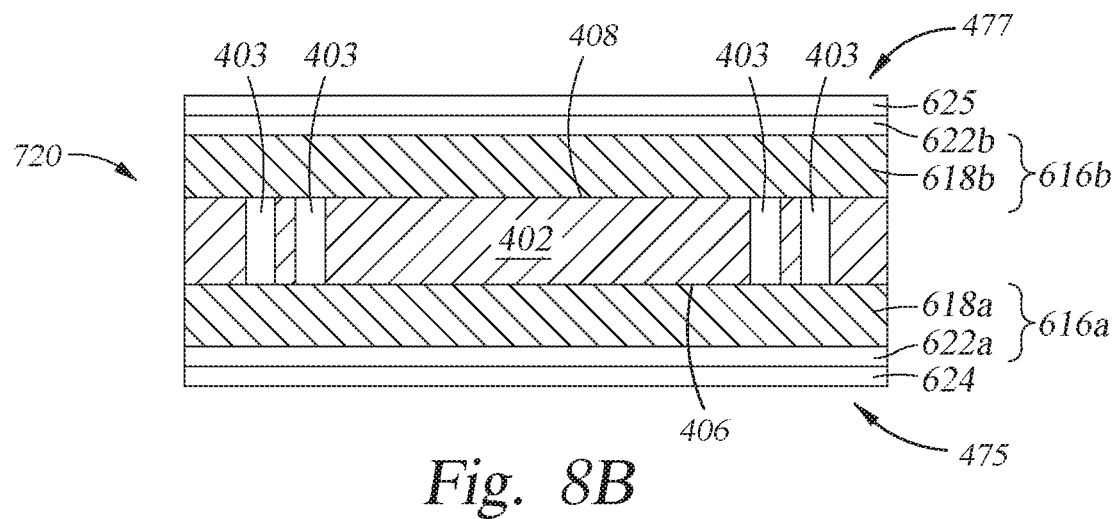

After fixing the first insulating film 616a to the first surface 406 on the first side 475 of the core structure 402, a second insulating film 616b is coupled to the second surface 408 on the opposing side 477 at operation 720 and FIG. 8B. In some embodiments, the second insulating film 616b is positioned on the surface 408 of the core structure 402 such that the epoxy resin layer 618b of the second insulating film 616b covers all of the core vias 403. As depicted in FIG. 8B, the core vias 403 form one or more voids or gaps between the insulating films 616a and 616b. In some embodiments, a second carrier 625 is affixed to the protective layer 622b of the second insulating film 616b for additional mechanical support during later processing operations.

Figure 8C:
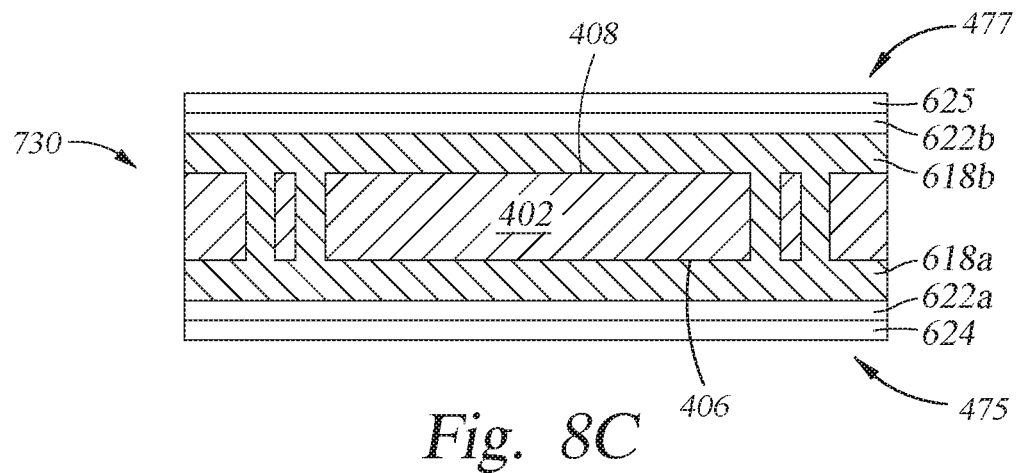

At operation 730 and FIG. 8C, the core structure 402, now affixed to the insulating films 616a and 616b on opposing sides thereof, is exposed to a single lamination process. During the single lamination process, the core structure 402 is exposed to elevated temperatures, causing the epoxy resin layers 618a and 618b of both insulating films 616a, 616b to soften and flow into the open voids or volumes created by the core vias 403 between the insulating films 616a, 616b. Accordingly, the core vias 403 become filled with the insulating material of the epoxy resin layers 618a and 618b.

Similar to the lamination processes described with reference to FIG. 5 and FIGS. 6A-6I, the lamination process at operation 730 may be a vacuum lamination process that may be performed in an autoclave or other suitable device. In another embodiment, the lamination process is performed by use of a hot pressing process. In one embodiment, the lamination process is performed at a temperature between about 80° C. and about 140° C. and for a period between about 1 minute and about 30 minutes. In some embodiments, the lamination process includes the application of a pressure between about 1 psig and about 150 psig while a temperature between about 80° C. and about 140° C. is applied to core structure 402 and the insulating films 616a, 616b for a period between about 1 minute and about 30 minutes. For example, the lamination process is performed at a pressure between about 10 psig and about 100 psig, a temperature between about 100° C. and about 120° C., and for a period between about 2 minutes and 10 minutes. For example, the lamination process at operation 730 is performed at a temperature of about 110° C. for a period of about 5 minutes.

Figure 8D:
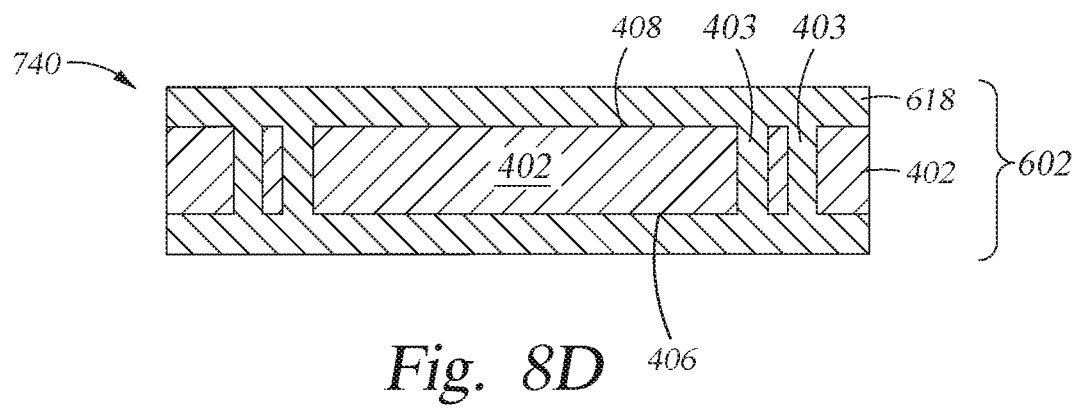
Figure 8E:
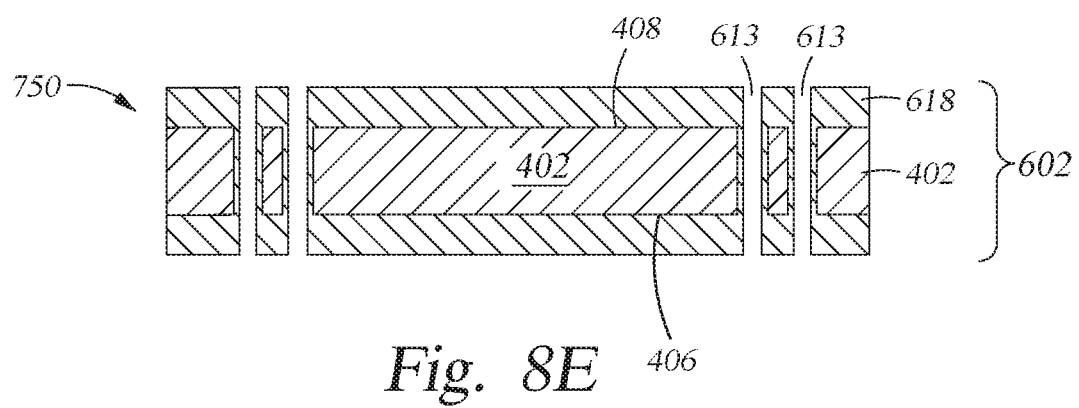

At operation 740, the one or more protective layers of the insulating films 616a, 616b are removed from the core structure 402, resulting in the laminated intermediate core assembly 602. In one example, the protective layers 622a, 622b are removed from the core structure 402, and thus the intermediate core assembly 602 is also disengaged from the first and second carriers 624, 625. Generally, the protective layers 622a, 622b and the carriers 624, 625 are removed by any suitable mechanical processes such as peeling therefrom. As depicted in FIG. 8D, the intermediate core assembly 602 includes the core structure 402 having one or more core vias 403 formed therein and filled with the insulating dielectric material of the epoxy resin layers 618a, 618b. The insulating material further encases the core structure 402 such that the insulating material covers at least two surfaces or sides of the core structure 402, for example, the surfaces 406, 408.

Upon removal of the protective layers 622a, 622b, the intermediate core assembly 602 is exposed to a cure process to fully cure the insulating dielectric material of the epoxy resin layers 618a, 618b. Curing of the insulating material results in the formation of the insulating layer 618. As depicted in FIG. 8D and similar to operation 516 corresponding with FIG. 6H, the insulating layer 618 substantially surrounds the core structure 402 and fills the core vias 403.

In one embodiment, the cure process is performed at high temperatures to fully cure the intermediate core assembly 602. For example, the cure process is performed at a temperature between about 140° C. and about 220° C. and for a period between about 15 minutes and about 45 minutes, such as a temperature between about 160° C. and about 200° C. and for a period between about 25 minutes and about 35 minutes. For example, the cure process is performed at a temperature of about 180° C. for a period of about 30 minutes. In further embodiments, the cure process at operation 740 is performed at or near ambient (e.g. atmospheric) pressure conditions.

After curing at operation 740, the method 700 is substantially similar to operation 520 of the method 500. Accordingly, one or more through-assembly vias 613 are drilled through the intermediate core assembly 602, followed by exposing the intermediate core assembly 602 to a de-smear process. Upon completion of the de-smear process, the intermediate core assembly 602 is ready for formation of interconnection paths therein, as described below.

Figure 9:
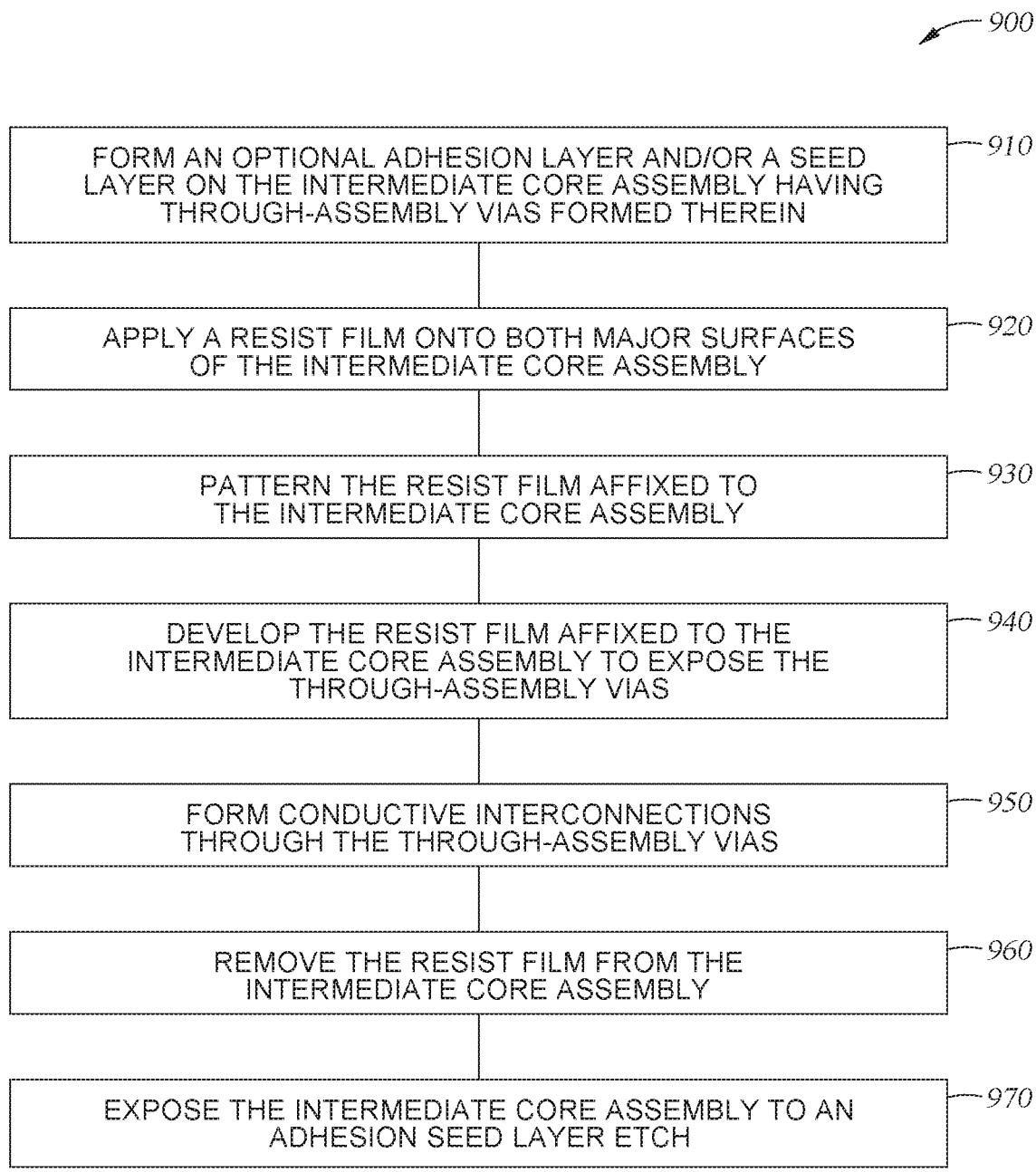
FIG. 9 is a flow diagram that illustrates a process for forming interconnections in a semiconductor core assembly, according to an embodiment described herein.

FIG. 9 illustrates a flow diagram of a representative method 900 for forming electrical interconnections through the intermediate core assembly 602. FIGS. 10A-10H schematically illustrate cross-sectional views of the intermediate core assembly 602 at different stages of the process of the method 900 depicted in FIG. 9. Thus, FIG. 9 and FIGS. 10A-10H are herein described together for clarity.

Figure 10A:
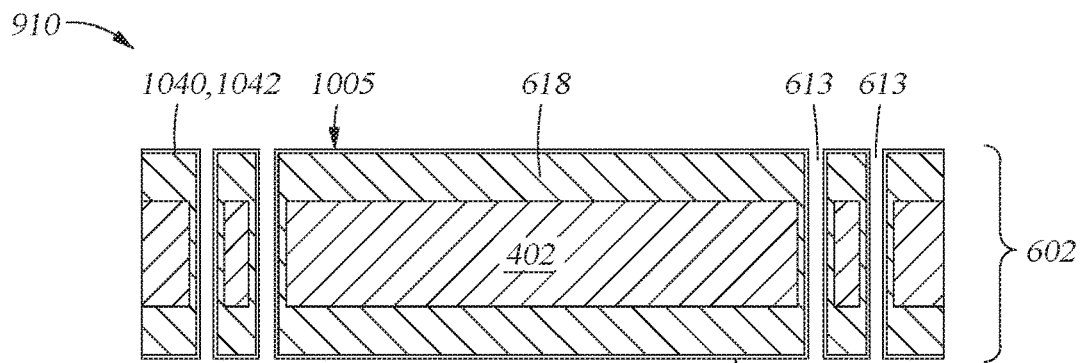
FIGS. 10A-10H schematically illustrate cross-sectional views of the semiconductor core assembly at different stages of the process depicted in FIG. 9, according to an embodiment described herein.
Figure 10B:
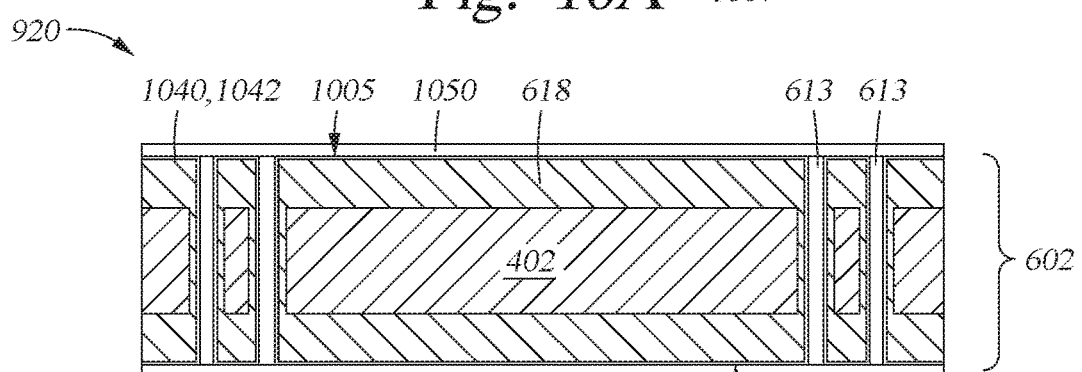
Figure 10C:
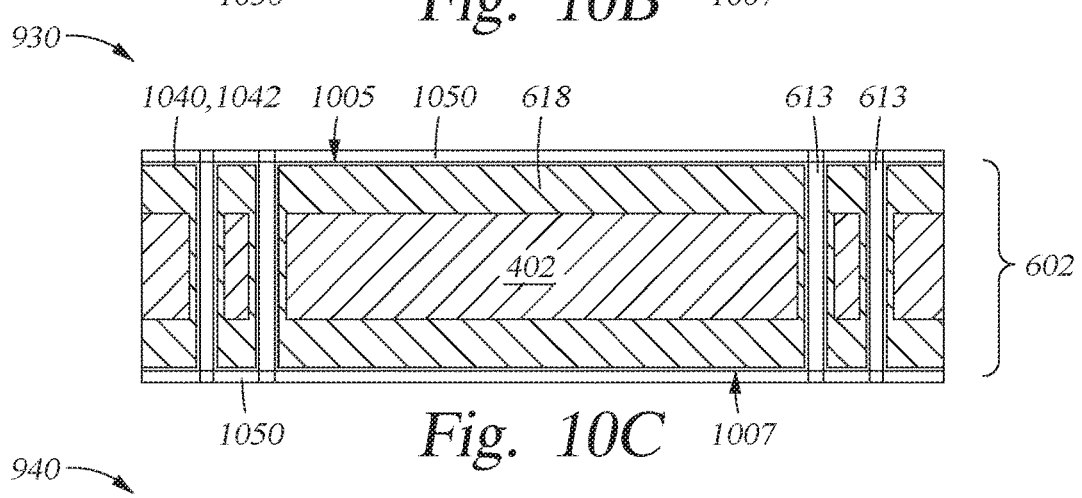
Figure 10D:
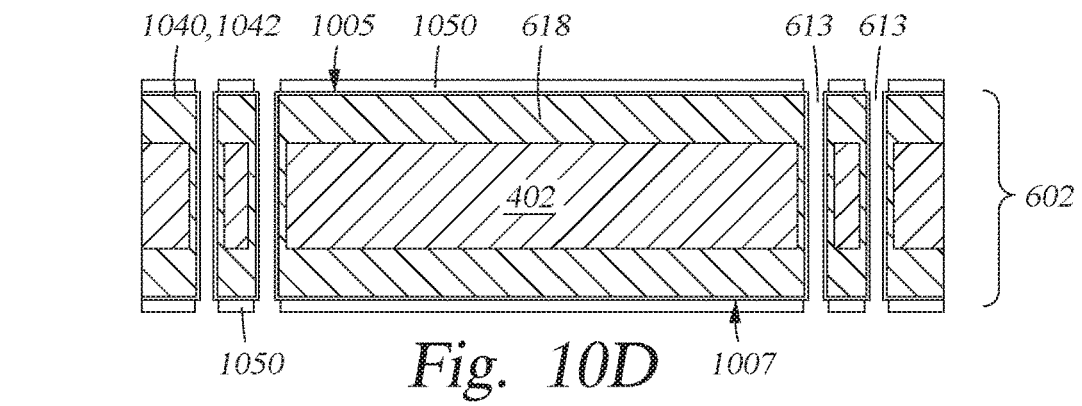

In one embodiment, the electrical interconnections formed through the intermediate core assembly 602 are formed of copper. Thus, the method 900 generally begins at operation 910 and FIG. 10A wherein the intermediate core assembly 602, having through-assembly vias 613 formed therein, has a barrier or adhesion layer 1040 and/or a seed layer 1042 formed thereon. An enlarged partial view of the adhesion layer 1040 and the seed layer 1042 formed on the intermediate core assembly 602 is depicted in FIG. 10H for reference. The adhesion layer 1040 may be formed on desired surfaces of the insulating layer 618, such as surfaces corresponding with the major surfaces 1005, 1007 of the intermediate core assembly 602 as well as sidewalls of the through-assembly vias 613, to assist in promoting adhesion and blocking diffusion of the subsequently formed seed layer 1042 and electrical interconnections 1044. Thus, in one embodiment, the adhesion layer 1040 acts as an adhesion layer; in another embodiment, the adhesion layer 1040 acts as a barrier layer. In both embodiments, however, the adhesion layer 1040 will be hereinafter described as an "adhesion layer."

In one embodiment, the adhesion layer 1040 is formed of titanium, titanium nitride, tantalum, tantalum nitride, manganese, manganese oxide, molybdenum, cobalt oxide, cobalt nitride, or any other suitable materials or combinations thereof. In one embodiment, the adhesion layer 1040 has a thickness between about 10 nm and about 300 nm, such as between about 50 nm and about 150 nm. For example, the adhesion layer 1040 has a thickness between about 75 nm and about 125 nm, such as about 100 nm. The adhesion layer 1040 is formed by any suitable deposition process, including but not limited to chemical vapor deposition (CVD), physical vapor deposition (PVD), plasma enhanced CVD (PECVD), atomic layer deposition (ALD), or the like.

The seed layer 1042 may be formed on the adhesion layer 1040 or directly on the insulating layer 618 (e.g., without the formation of the adhesion layer 1040). In some embodiments, the seed layer 1042 is formed on all surfaces of the insulating layer 618 while the adhesion layer 1040 is only formed on desired surfaces or desired portions of surfaces of the insulating layer 618. For example, the adhesion layer 1040 may be formed on the major surfaces 1005, 1007 and not on the sidewalls of the through-assembly vias 613 while the seed layer 1042 is formed on the major surfaces 1005, 1007 as well as sidewalls of the through-assembly vias 613. The seed layer 1042 is formed of a conductive material such as copper, tungsten, aluminum, silver, gold, or any other suitable materials or combinations thereof. In one embodiment, the seed layer 1042 has a thickness between about 0.05 μm and about 0.5 μm, such as a thickness between about 0.1 μm and about 0.3 μm. For example, the seed layer 1042 has a thickness between about 0.15 μm and about 0.25 μm, such as about 0.2 μm. In one embodiment, the seed layer 1042 has a thickness between about 0.1 μm and about 1.5 μm. Similar to the adhesion layer 1040, the seed layer 1042 is formed by any suitable deposition process, such as CVD, PVD, PECVD, ALD dry processes, wet electroless plating processes, or the like. In one embodiment, a copper seed layer 1042 may be formed on a molybdenum adhesion layer 1040 on the intermediate core assembly 602. The molybdenum adhesion and copper seed layer combination enables improved adhesion with the surfaces of the insulating layer 618 and reduces undercut of conductive interconnect lines during a subsequent seed layer etch process at operation 970.

At operations 920 and 930, corresponding to FIGS. 10B and 10C, respectively, a spin-on/spray-on or dry resist film 1050, such as a photoresist, is applied to both major surfaces 1005, 1007 of the intermediate core assembly 602 and subsequently patterned. In one embodiment, the resist film 1050 is patterned via selective exposure to UV radiation. In one embodiment, an adhesion promoter (not shown) is applied to the intermediate core assembly 602 prior to formation of the resist film 1050. The adhesion promoter improves adhesion of the resist film 1050 to the intermediate core assembly 602 by producing an interfacial bonding layer for the resist film 1050 and by removing any moisture from the surface of the intermediate core assembly 602. In some embodiments, the adhesion promoter is formed of bis(trimethylsilyl)amine or hexamethyldisilizane (HMDS) and propylene glycol monomethyl ether acetate (PGMEA).

At operation 940, the intermediate core assembly 602 is exposed to a resist film development process. As depicted in FIG. 10D, development of the resist film 1050 results in exposure of the through-assembly vias 613, which may now have an adhesion layer 1040 and/or a seed layer 1042 formed thereon. In one embodiment, the film development process is a wet process, such as a wet process that includes exposing the resist film 1050 to a solvent. In one embodiment, the film development process is a wet etch process utilizing an aqueous etch process. For example, the film development process is a wet etch process utilizing a buffered etch process selective for a desired material. Any suitable wet solvents or combination of wet etchants may be used for the resist film development process.

Figure 10E:
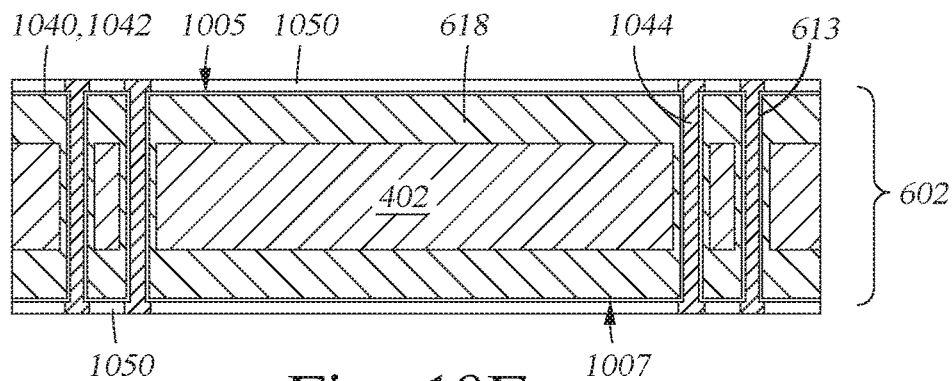
Figure 10F:
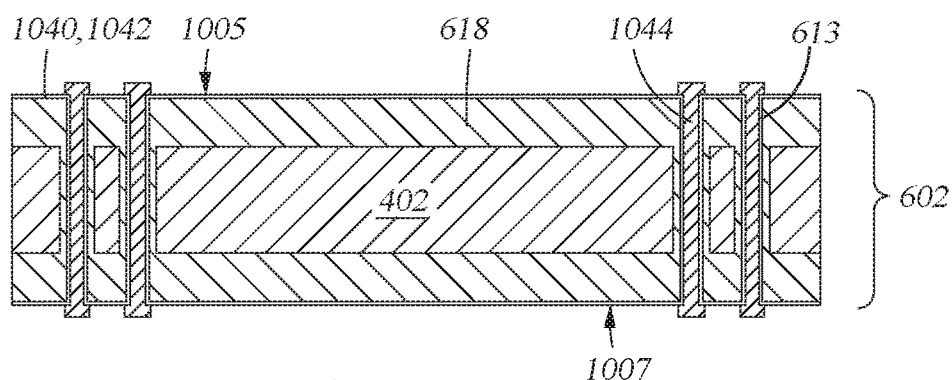

At operations 950 and 960, corresponding to FIGS. 10E and 10F respectively, electrical interconnections 1044 are formed through the exposed through-assembly vias 613 and the resist film 1050 is thereafter removed. The interconnections 1044 are formed by any suitable methods, including electroplating and electroless plating. In one embodiment, the resist film 1050 is removed via a wet process. As depicted in FIGS. 10E and 10F, the electrical interconnections 1044 may completely fill the through-assembly vias 613 and protrude from the surfaces 1005, 1007 of the intermediate core assembly 602 upon removal of the resist film 1050. In some embodiments, the electrical interconnections 1044 may only line the sidewalls of the through-assembly vias 613 without completely filling the through-assembly vias 613. In one embodiment, the electrical interconnections 1044 are formed of copper. In other embodiments, the electrical interconnections 1044 may be formed of any suitable conductive material including but not limited to aluminum, gold, nickel, silver, palladium, tin, or the like.

Figure 10G:
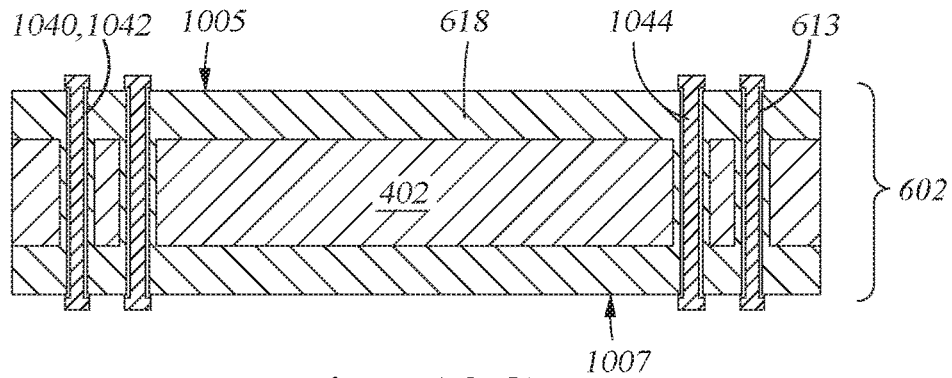
Figure 10H:
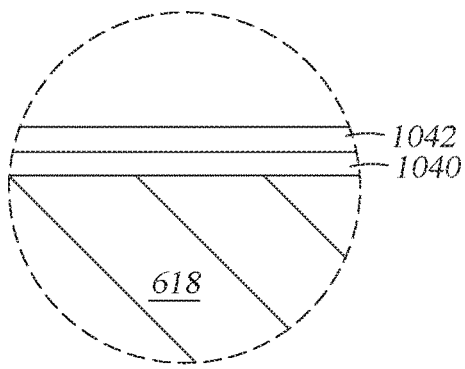

At operation 970 and FIG. 10G, the intermediate core assembly 602 having electrical interconnections 1044 formed therein is exposed to a seed layer etch process to remove the exposed adhesion layer 1040 and seed layer 1042 on external surfaces thereof (e.g., surfaces 1005, 1007). In some embodiments, the adhesion layer 1040 and/or seed layer 1042 formed between the electrical interconnections 1044 and the sidewalls of the through-assembly vias 613 may remain after the seed layer etch process. In one embodiment, the seed layer etch is a wet etch process including a rinse and drying of the intermediate core assembly 602. In one embodiment, the seed layer etch process is a buffered etch process selective for a desired material such as copper, tungsten, aluminum, silver, or gold. In other embodiments, the etch process is an aqueous etch process. Any suitable wet etchant or combination of wet etchants may be used for the seed layer etch process.

Following the seed layer etch process at operation 970, one or more semiconductor core assemblies may be singulated from the intermediate core assembly 602 and utilized as a fully-functional electronic mounting or package structure. For example, the one or more semiconductor core assemblies may be singulated and utilized as circuit board structures, chip carrier structures, integrated circuit packages, and the like. Alternatively, the intermediate core assembly 602 may have one or more redistribution layers 1260 (shown in FIGS. 12J and 12K) formed thereon to reroute external contact points of the electrical interconnections 1044 to desired locations on the surfaces of the final semiconductor core assemblies.

Figure 11:
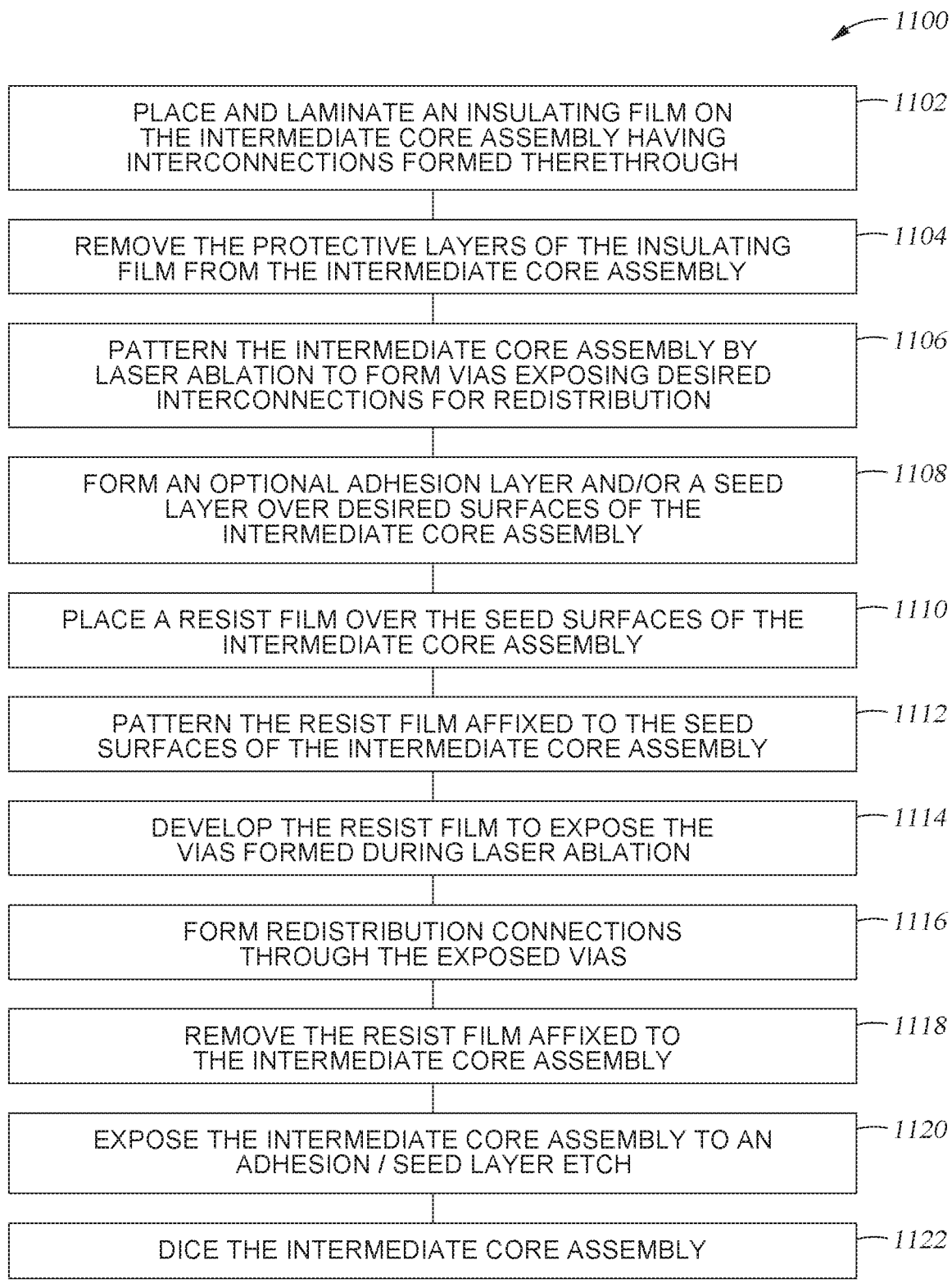
FIG. 11 is a flow diagram that illustrates a process for forming a redistribution layer on a semiconductor core assembly, according to an embodiment described herein.

FIG. 11 illustrates a flow diagram of a representative method 1100 of forming a redistribution layer 1260 on the intermediate core assembly 602. FIGS. 12A-12K schematically illustrate cross-sectional views of the intermediate core assembly 602 at different stages of the method 1100 depicted in FIG. 11. Thus, FIG. 11 and FIGS. 12A-12K are herein described together for clarity.

Figure 12A:
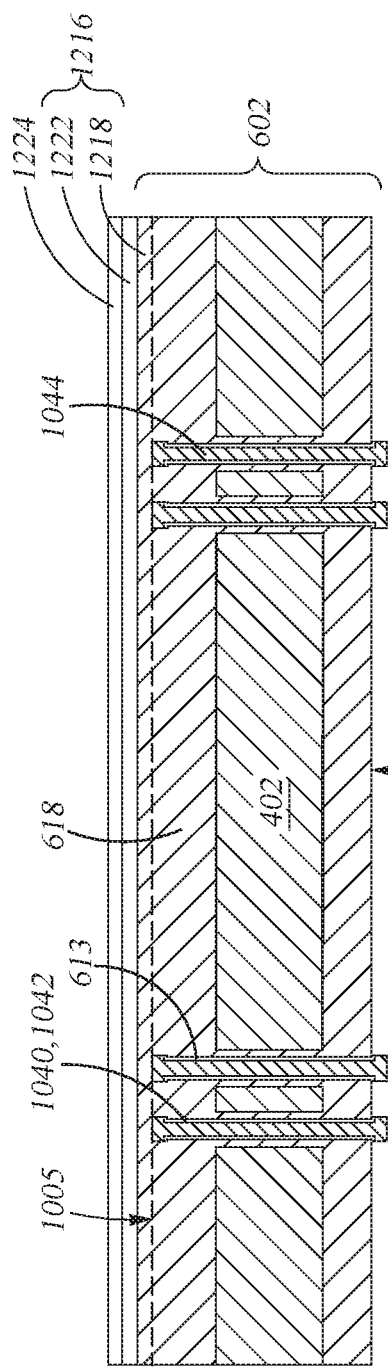

The method 1100 is substantially similar to the methods 500, 700, and 900 described above. Generally, the method 1100 begins at operation 1102 and FIG. 12A, wherein an insulating film 1216 is affixed to the intermediate core assembly 602 and is thereafter laminated. The insulating film 1216 is substantially similar to the insulating films 616a, 616b. In one embodiment, as depicted in FIG. 12A, the insulating film 1216 includes an epoxy resin layer 1218 and one or more protective layers. For example, the insulating film 1216 may include a protective layer 1222. Any suitable combination of layers and insulating materials is contemplated for the insulating film 1216. In some embodiments, an optional carrier 1224 is coupled to the insulating film 1216 for added support. In some embodiments, a protective film (not shown) may be coupled to the insulating film 1216.

Generally, the epoxy resin layer 1218 has a thickness of less than about 60 µm, such as between about 5 µm and about 50 µm. For example, the epoxy resin layer 1218 has a thickness of between about 10 µm and about 25 µm. In one embodiment, the epoxy resin layer 1218 and the PET protective layer 1222 have a combined thickness of less than about 120 µm, such as a thickness of less than about 90 µm. The insulating film 1216, and specifically the epoxy resin layer 1218, is affixed to a surface of the intermediate core assembly 602 having exposed electrical interconnections 1044, such as the major surface 1005.

After placement of the insulating film 1216, the intermediate core assembly 602 is exposed to a lamination process substantially similar to the lamination process described with regard to operations 506, 514, and 730. The intermediate core assembly 602 is exposed to elevated temperatures to soften the epoxy resin layer 1218 of the insulating film 1216, which subsequently bonds to the insulating layer 618. Thus, the epoxy resin layer 1218 becomes integrated with the insulating layer 618 and forms an extension thereof, and will thus be described hereinafter as a singular insulating layer 618. The integration of the epoxy resin layer 1218 and the insulating layer 618 further results in an enlarged insulating layer 618 enveloping the previously exposed electrical interconnections 1044.

Figure 12B:
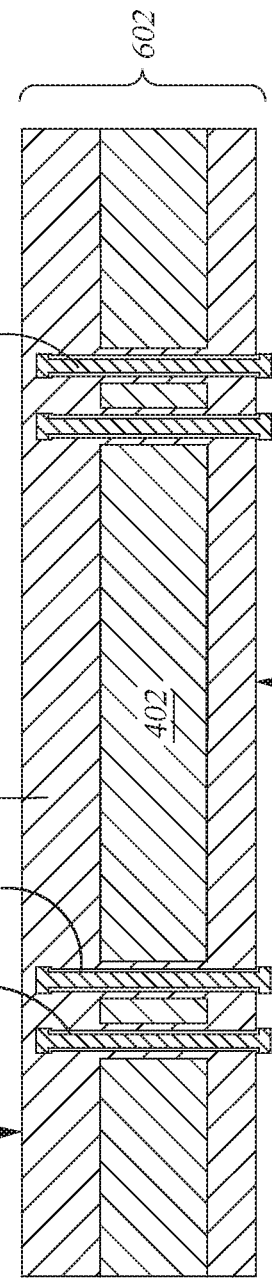

At operation 1104 and FIG. 12B, the protective layer 1222 and the carrier 1224 are removed from the intermediate core assembly 602 by mechanical means, and the intermediate core assembly 602 is exposed to a cure process to fully harden the newly expanded insulating layer 618. In one embodiment, the cure process is substantially similar to the cure process described with reference to operations 516 and 740. For example, the cure process is performed at a temperature between about 140° C. and about 220° C. and for a period between about 15 minutes and about 45 minutes.

Figure 12C:
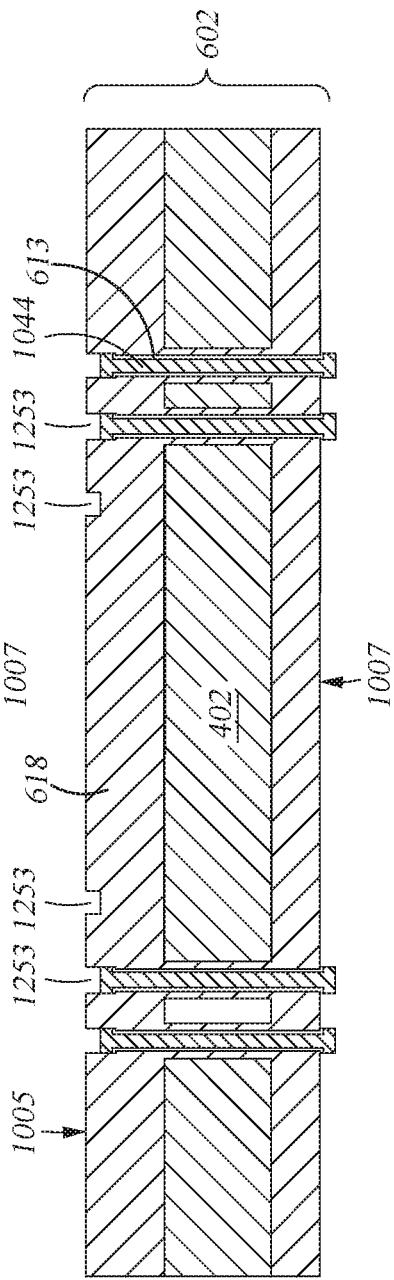

The intermediate core assembly 602 is then selectively patterned by laser ablation at operation 1106 and FIG. 12C. The laser ablation process at operation 1106 forms one or more redistribution vias 1253 in the newly expanded insulating layer 618 and exposes desired electrical interconnections 1044 for redistribution of contact points thereof. In one embodiment, the redistribution vias 1253 have a diameter substantially similar to or smaller than the diameter of the through-assembly vias 613. For example, the redistribution vias 1253 have a diameter between about 5 µm and about 600 µm, such as a diameter of between about 10 µm and about 50 µm, such as between about 20 µm and about 30 µm. In one embodiment, the laser ablation process at operation 1106 is performed utilizing a $CO_2$ laser. In one embodiment, the laser ablation process at operation 1106 is performed utilizing a UV laser. In another embodiment, the laser ablation process at operation 1106 is performed utilizing a green laser. In one example, the laser source may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 µJ and about 300 µJ.

Figure 12D:
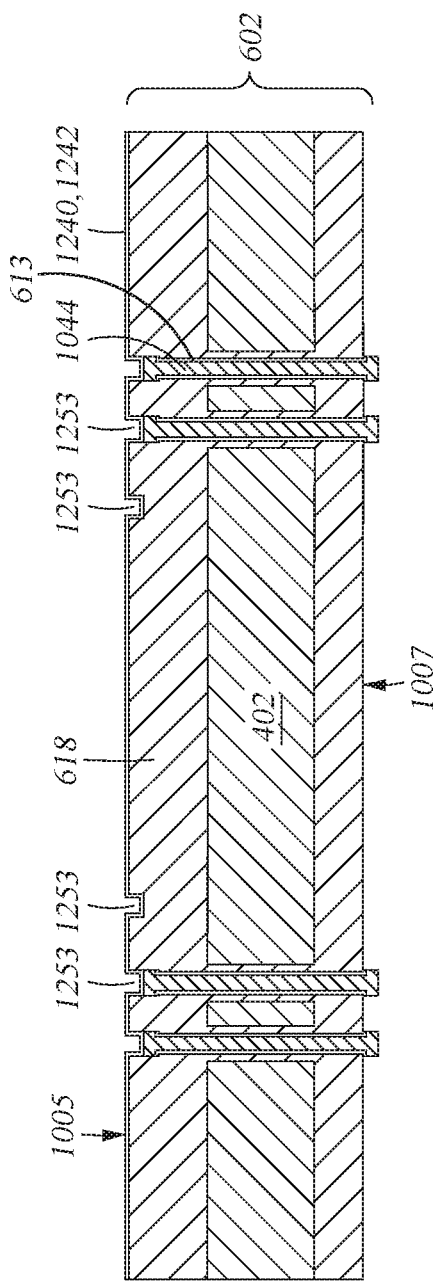

At operation 1108 and FIG. 12D, an adhesion layer 1240 and/or a seed layer 1242 are optionally formed on one or more surfaces of the insulating layer 618. In one embodiment, the adhesion layer 1240 and the seed layer 1242 are substantially similar to the adhesion layer 1040 and the seed layer 1042, respectively. For example, the adhesion layer 1240 is formed from titanium, titanium nitride, tantalum, tantalum nitride, manganese, manganese oxide, molybdenum, cobalt oxide, cobalt nitride, or any other suitable materials or combinations thereof. In one embodiment, the adhesion layer 1240 has a thickness between about 10 nm and about 300 nm, such as a thickness between about 50 nm and about 150 nm. For example, the adhesion layer 1240 has a thickness between about 75 nm and about 125 nm, such as about 100 nm. The adhesion layer 1240 may be formed by any suitable deposition process, including but not limited to CVD, PVD, PECVD, ALD, or the like.

The seed layer 1242 is formed from a conductive material such as copper, tungsten, aluminum, silver, gold, or any other suitable materials or combinations thereof. In one embodiment, the seed layer 1242 has a thickness between about 0.05 µm and about 0.5 µm, such as between about 0.1 µm and about 0.3 µm. For example, the seed layer 1242 has a thickness between about 0.15 µm and about 0.25 µm, such as about 0.2 µm. Similar to the adhesion layer 1240, the seed layer 1242 may be formed by any suitable deposition process, such as CVD, PVD, PECVD, ALD dry processes, wet electroless plating processes, or the like. In one embodiment, a molybdenum adhesion layer 1240 and a copper seed layer 1242 are formed on the intermediate core assembly 602 to reduce the formation of undercut during a subsequent seed layer etch process at operation 1122.

Figure 12E:
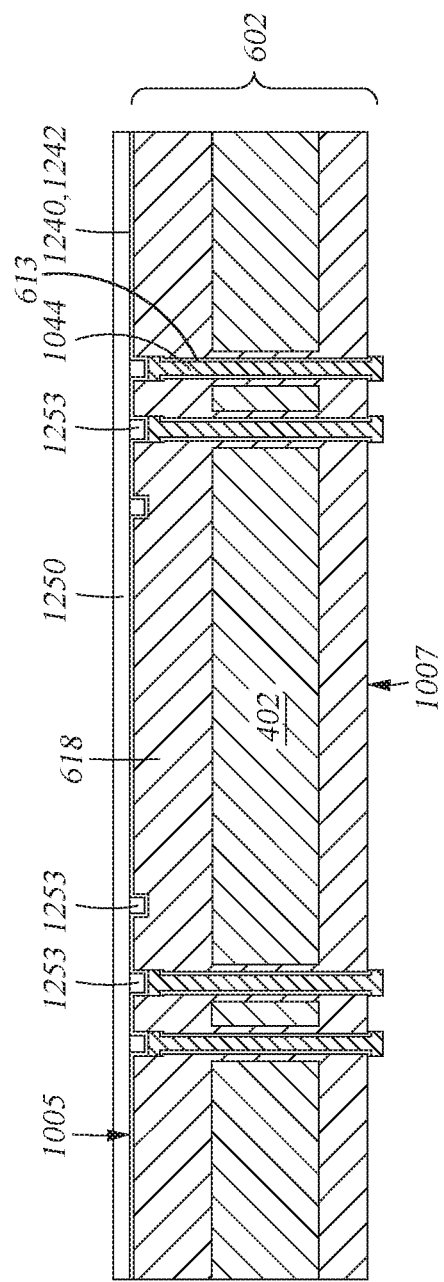
Figure 12F:
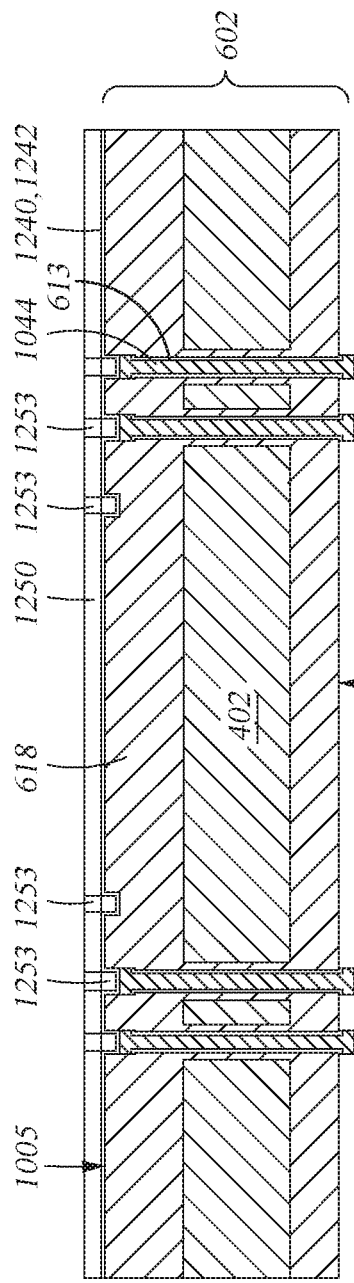
Figure 12G:
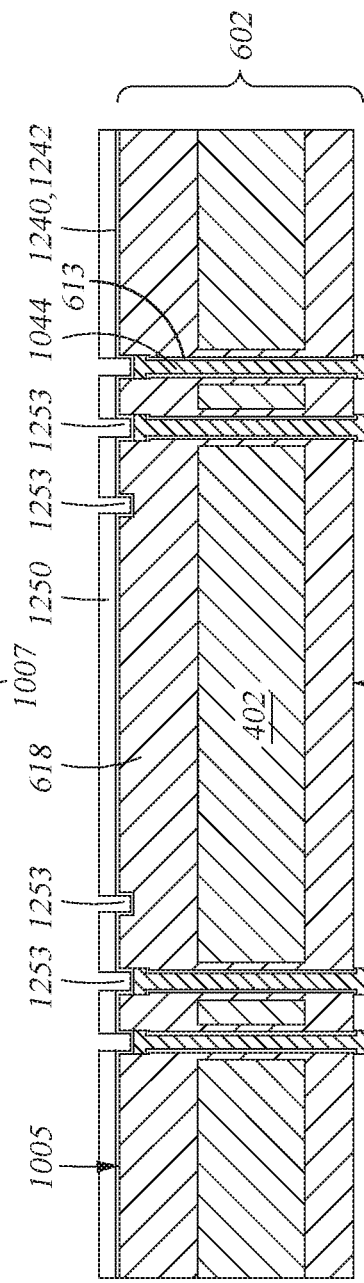

At operations 1110, 1112, and 1114, corresponding to FIGS. 12E, 12F, and 12G, respectively, a spin-on/spray-on or dry resist film 1250, such as a photoresist, is applied over the seeded surfaces of the intermediate core assembly 602 and subsequently patterned and developed. In one embodiment, an adhesion promoter (not shown) is applied to the intermediate core assembly 602 prior to placement of the resist film 1250. The exposure and development of the resist film 1250 results in opening of the redistribution vias 1253. Thus, patterning of the resist film 1250 may be performed by selectively exposing portions of the resist film 1250 to UV radiation, and subsequent development of the resist film 1250 by a wet process, such as a wet etch process. In one embodiment, the resist film development process is a wet etch process utilizing a buffered etch process selective for a desired material. In other embodiments, the resist film development process is a wet etch process utilizing an aqueous etch process. Any suitable wet etchant or combination of wet etchants may be used for the resist film development process.

Figure 12H:
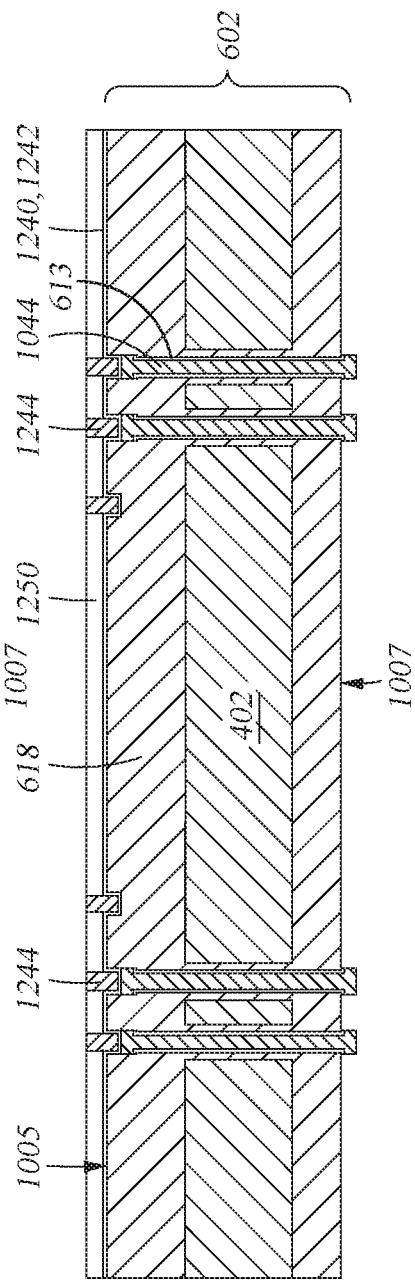
Figure 12K:
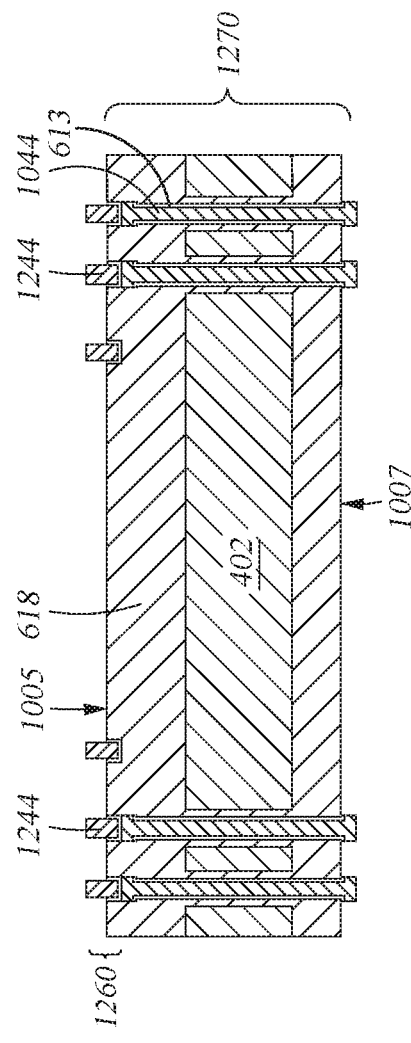
Figure 12L:
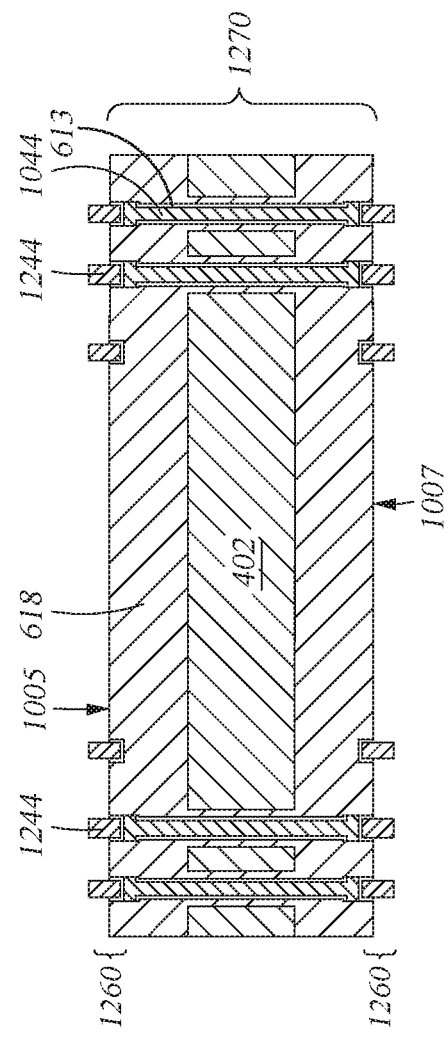

At operations 1116 and 1118, corresponding to FIGS. 12H and 12I, respectively, redistribution connections 1244 are formed through the exposed redistribution vias 1253 and the resist film 1250 is thereafter removed. In one embodiment, the resist film 1250 is removed via a wet process. As depicted in FIGS. 12H and 12I, the redistribution connections 1244 fill the redistribution vias 1253 and protrude from the surfaces of the intermediate core assembly 602 upon removal of the resist film 1250. In one embodiment, the redistribution connections 1244 are formed of copper. In other embodiments, the redistribution connections 1244 are formed of any suitable conductive material including but not limited to aluminum, gold, nickel, silver, palladium, tin, or the like. Any suitable methods may be utilized to form the redistribution connections 1244, including electroplating and electroless deposition.

At operation 1120 and FIG. 12J, the intermediate core assembly 602 having the redistribution connections 1244 formed thereon is exposed to a seed layer etch process substantially similar to that of operation 970. In one embodiment, the seed layer etch is a wet etch process including a rinse and drying of the intermediate core assembly 602. In one embodiment, the seed layer etch process is a wet etch process utilizing a buffered etch process selective for a desired material of the seed layer 1242. In other embodiments, the etch process is a wet etch process utilizing an aqueous etch process. Any suitable wet etchant or combination of wet etchants may be used for the seed layer etch process.

Upon completion of the seed layer etch process at operation 1120, one or more additional redistribution layers 1260 may be formed on the intermediate core assembly 602 utilizing the sequences and processed described above. For example, one or more additional redistribution layers 1260 may be formed on the first redistribution layer 1260 and/or an opposing surface of the intermediate core assembly 602, such as major surface 1007. In one embodiment, the one or more additional redistribution layers 1260 may be formed of polymer-based dielectric materials, such as a flowable build-up materials, that are different from the material of the first redistribution layer 1260 and/or the insulating layer 618. For example, in some embodiments, the insulating layer 618 may be formed of an epoxy filled with ceramic fibers, while the first and/or any additional redistribution layers 1260 are formed of polyimide, BCB, and/or PBO. Alternatively, at operation 1122 and FIG. 12K, one or more completed semiconductor core assemblies 1270 may be singulated from the intermediate core assembly 602 after a desired number of redistribution layers 1260 is formed.

Figure 13A:
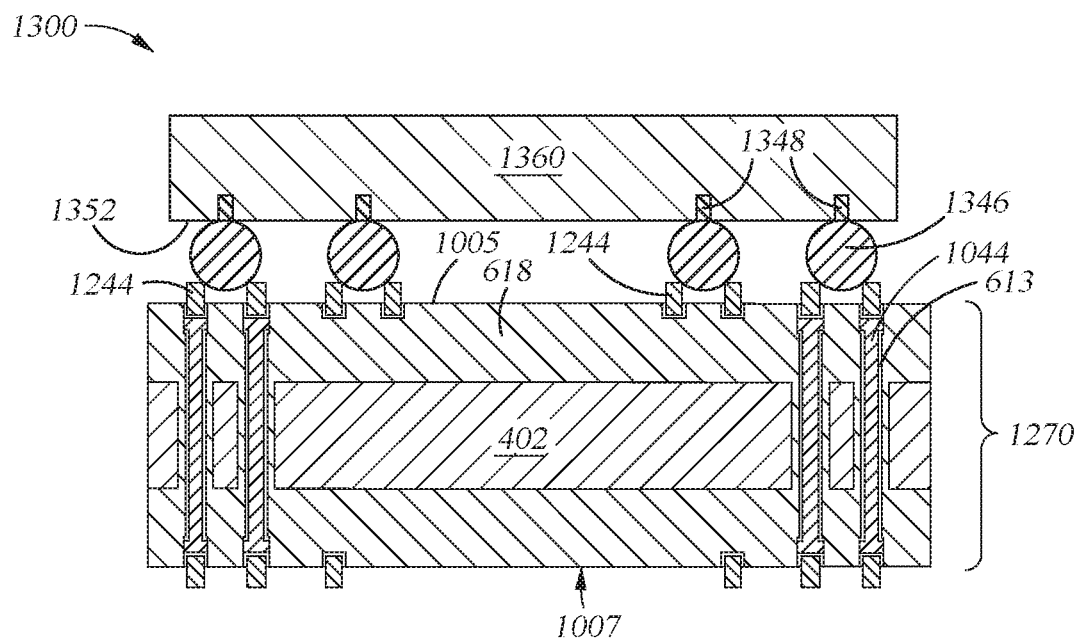
FIG. 13A schematically illustrates a cross-sectional view of a chip carrier structure including a semiconductor core assembly, according to an embodiment described herein.

The completed semiconductor core assemblies 1270 formed at operation 1120 may be utilized in any suitable package assembly, PCB assembly, PCB spacer assembly, chip carrier assembly, intermediate carrier assembly, and the like. In one exemplary embodiment depicted in FIG. 13A, a single semiconductor core assembly 1270 is utilized as a carrier for a chip 1360 in a chip carrier assembly 1300. The chip 1360 may be any suitable type of chip, including a memory chip, a microprocessor, a complex system-on-a-chip (SoC), or a standard chip. Suitable types of memory chips include DRAM chips or NAND flash chips. In some further examples, the chip 1360 is a digital chip, an analog chip, or a mixed chip. The chip 1360 is disposed adjacent to one of the major surfaces 1005, 1007 of the semiconductor core assembly 1270. In some embodiments, two or more chips 1360 may be disposed adjacent to a single major surface 1005, 1007. In another embodiment, one or additional devices and/or structures may be disposed adjacent to the chip 1360, such as one or more components of a PCB or a package substrate. For example, one or more passives may be disposed adjacent to the chip 1360, such as capacitors, resistors, inductors and the like. In another example, one or more connectors may be disposed adjacent to the chip 1360.

The chip 1360 includes one or more contacts 1348 formed on an active surface 1352 thereof. As depicted, the contacts 1348 are conductively coupled to one or more redistribution connections 1244 of the semiconductor core assembly 1270 by one of more solder bumps 1346 disposed between the active surface 1352 and the major surface 1005. In some embodiments, the contacts 1348 may be conductively coupled to the one or more interconnections 1044 by the one or more solder bumps 1346. In one embodiment, the contacts 1348 and/or the solder bumps 1346 are formed of a substantially similar material to that of the interconnections 1044 and the redistribution connections 1244. For example, the contacts 1348 and the solder bumps 1346 may be formed of a conductive material such as copper, tungsten, aluminum, silver, gold, or any other suitable materials or combinations thereof.

In one embodiment, the solder bumps 1346 include C4 solder bumps. In one embodiment, the solder bumps 1346 include C2 (Cu-pillar with a solder cap) solder bumps. Utilization of C2 solder bumps may enable smaller pitch lengths and improved thermal and/or electrical properties for the chip carrier assembly 1300. The solder bumps 1346 may be formed by any suitable wafer bumping processes, including but not limited to electrochemical deposition (ECD) and electroplating.

Figure 13B:
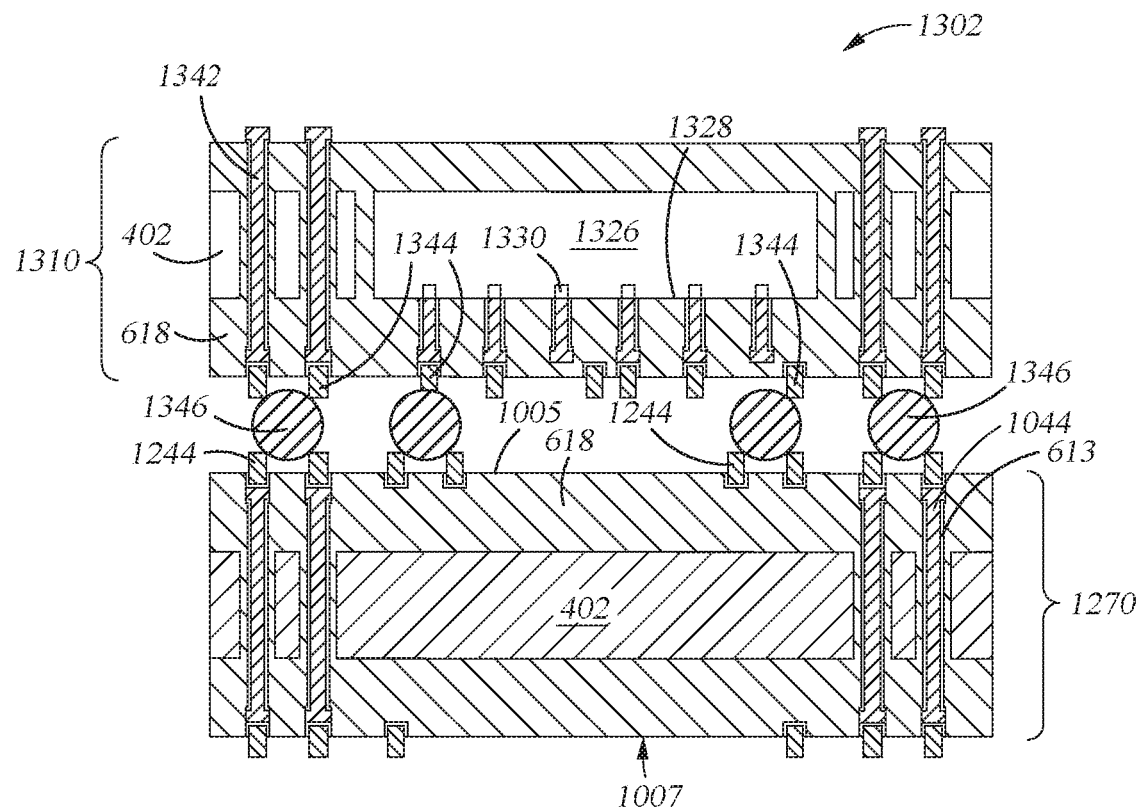
FIG. 13B schematically illustrates a cross-sectional view of a PCB structure including a semiconductor core assembly, according to an embodiment described herein.

In another exemplary embodiment depicted in FIG. 13B, a semiconductor core assembly 1270 is utilized in a PCB assembly 1302. Accordingly, the semiconductor core assembly 1270 is configured to function as a PCB structure for supporting (e.g., carrying) a package assembly 1310. The package assembly 1310 may be substantially similar in structure and material to the semiconductor core assembly 1270, but includes an embedded die 1326 disposed within a cavity 1320 formed within the core structure 402 that is substantially surrounded by the insulating layer 618. The embedded die 1326 may further include an active surface 1328 having one or more contacts 1330 formed thereon and coupled with interconnections 1342 and/or redistribution connections 1344 of the package assembly 1310. Similar to the chip carrier assembly 1300 in FIG. 13A, the contacts 1330 and/or interconnections 1342 and/or redistribution connections 1344 of the package assembly 1310 are conductively coupled to the one or more redistribution connections 1244 of the semiconductor core assembly 1270 by the one of more solder bumps 1346 disposed between the active surface 1328 and the major surface 1005. In some embodiments, the contacts 1330 may be conductively coupled to the one or more interconnections 1044 by the one or more solder bumps 1346.

Figure 13C:
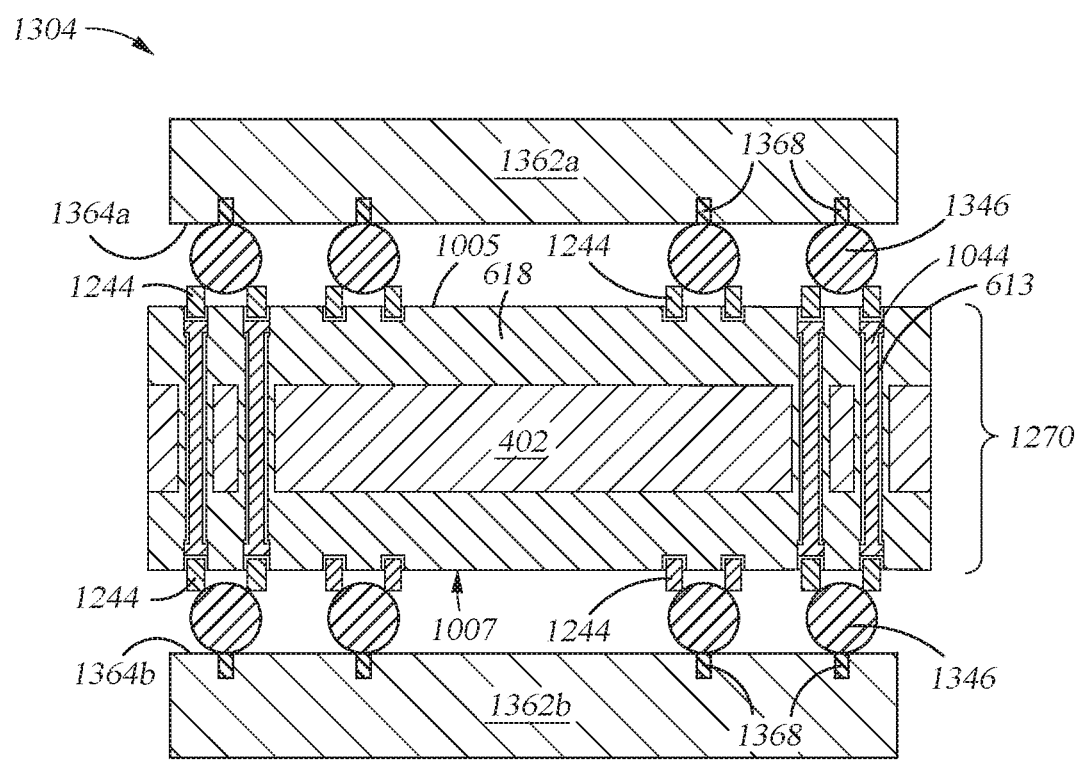
FIG. 13C schematically illustrates a cross-sectional view of a PCB structure including a semiconductor core assembly, according to an embodiment described herein.

FIG. 13C depicts yet another exemplary embodiment utilizing the semiconductor core assembly 1270 as a PCB spacer structure in a PCB assembly 1304. As shown, the semiconductor core assembly 1270 is disposed between two PCB's 1362a, 1362b and configured to position the first PCB 1362a relative to the second PCB 1362b such that a physical space remains between the first PCB 1362a and the second PCB 1362b while they are conductively connected. Accordingly, the PCB's 1362a, 1362b include one or more electrically conductive pads 1368 formed on major surfaces 1364a, 1364b thereof, respectively. The one or more conductive pads 1368 are conductively coupled to the redistribution connections 1244 and/or interconnections 1044 of the semiconductor core assembly 1270 via the one or more solder bumps 1346. Similar the contacts 1330, 1348, the conductive pads 1368 are formed of a substantially similar material to that of the solder bumps 1346, interconnections 1044, and the redistribution connections 1244 to enable electrical conductivity therethrough. For example, the conductive pads 1368 may be formed of a conductive material such as copper, tungsten, aluminum, silver, gold, or any other suitable materials or combinations thereof.

The utilization of the semiconductor core assembly 1270 in the embodiments shown above provides multiple advantages over conventional package, PCB, PCB spacer, and chip carrier structures. Such benefits include a thin-form-factor and high chip or die-to-package volume ratio, which enables greater I/O scaling to meet the ever-increasing bandwidth and power efficiency demands of artificial intelligence (AI) and high performance computing (HPC). The utilization of a structured silicon frame provides optimal material stiffness and thermal conductivity for improved electrical performance, thermal management, and reliability of 3-dimensional integrated circuit (3D IC) architecture. Furthermore, the fabrication methods for through-assembly vias and via-in-via structures described herein provide high performance and flexibility for 3D integration with relatively low manufacturing costs as compared to conventional TSV technologies.

By utilizing the methods described above, high aspect ratio features may be formed on glass and/or silicon core structures, thus enabling the economical formation of thinner and narrower circuit boards, chip carriers, integrated circuit packages, and the like. The semiconductor core assemblies fabricated utilizing the methods described above provide the benefits of not only high I/O density and improved bandwidth and power, but also greater reliability with low stress attributed to the reduced weight/inertia and assembly architecture allowing flexible solder ball distribution. Further merits of the methods described above include economical manufacturing with dual-sided metallization capability and high production yield. Additionally, the utilization of a silicon core reduces or eliminates mismatch of the coefficient of thermal expansion (CTE) between the core assembly and any chips connected thereto, enabling the smaller soldering pitches and increased device density.

While the foregoing is directed to embodiments of the present disclosure, other and further embodiments of the disclosure may be devised without departing from the basic scope thereof, and the scope thereof is determined by the claims that follow.

What is claimed is:

1. A semiconductor device assembly, comprising:
   a silicon core structure having a first side opposing a second side, the silicon core structure having a thickness less than 1000 μm, the silicon core structure further comprising:
   a via comprising a via surface that defines an opening extending through the silicon core structure from the first side to the second side;
   an oxide layer formed over the first side, the second side, and the via surface; and
   a conductive interconnection formed through the via and protruding from the first side and the second side;
   an insulating layer disposed over the oxide layer on the first side, the second side, and within the opening;
   a first redistribution layer formed on the first side; and
   a second redistribution layer formed on the second side, wherein the first redistribution layer and the second redistribution layer each have one or more conductive contacts formed thereon.

2. The semiconductor device assembly of claim 1, wherein the oxide layer comprises a thermal oxide.

3. The semiconductor device assembly of claim 1, wherein the insulating layer comprises an epoxy resin.

4. The semiconductor device assembly of claim 3, wherein the epoxy resin comprises silica particles.

5. The semiconductor device assembly of claim 4, wherein the silica particles in the insulating layer range in size between about 300 nm and about 600 nm.

6. The semiconductor device assembly of claim 3, wherein the insulating layer has a thickness of between about 5 μm and about 50 μm.

7. The semiconductor device assembly of claim 3, wherein the first redistribution layer and the second redistribution layer each further comprise:
   an adhesion layer formed on the insulating layer, the adhesion layer comprising molybdenum;
   a seed layer formed on the adhesion layer; and
   a copper layer formed over the seed layer.

8. The semiconductor device assembly of claim 7, wherein the adhesion layer has a thickness between about 10 nm and about 500 nm.

9. The semiconductor device assembly of claim 1, wherein the conductive interconnection within the opening is circumferentially defined by the insulating layer, and the insulating layer within the opening is circumferentially defined by the oxide layer.

10. The semiconductor device assembly of claim 1, wherein the silicon core structure comprises a polycrystalline p-type or n-type silicon substrate.

11. The semiconductor device assembly of claim 1, wherein the conductive interconnection comprises a hollow core.

12. A semiconductor device assembly, comprising:
a silicon core structure having a first surface opposing a second surface, the silicon core structure having a thickness less than 1000 μm, the silicon core structure further comprising:
- a via comprising a via surface that defines an opening extending through the silicon core structure from the first surface to the second surface; and
- a passivating layer surrounding the silicon core structure, the passivating layer comprising a thermal oxide; and
- a dielectric layer formed over the passivating layer on at least the first surface, the second surface, and within the opening, the dielectric layer comprising an epoxy resin having silica particles disposed therein.

13. The semiconductor device assembly of claim 12, wherein the silicon core structure comprises a crystalline silicon substrate.

14. The semiconductor device assembly of claim 12, wherein the via has a diameter less than about 500 μm.

15. The semiconductor device assembly of claim 14, wherein the via is one of a plurality of vias disposed through the silicon core structure, a pitch between each via of the plurality of vias has a distance between about 40 μm and 1000 μm.

16. The semiconductor device assembly of claim 12, further comprising a first redistribution layer formed on the dielectric layer.

17. The semiconductor device assembly of claim 16, wherein the first redistribution layer further comprises:
- an adhesion layer formed on the dielectric layer, the adhesion layer comprising molybdenum;
- a seed layer formed on the adhesion layer; and
- a copper layer formed over the seed layer.

18. The semiconductor device assembly of claim 12, further comprising a conductive interconnection formed within the opening extending from the first side to the second side, the conductive interconnection circumferentially defined by the dielectric layer.

19. A semiconductor device assembly, comprising:
- a silicon core structure having a first side opposing a second side and a plurality of vias that extend from the first side to the opposing second side, each of the plurality of vias comprising a via surface that defines an opening extending through the core silicon structure from the first side to the second side;
- a passivating layer disposed over the first side, the second side and the via surface of each of the plurality of vias of the silicon core structure, the passivating layer comprising a thermal oxide;
- a dielectric layer disposed over the passivating layer on the first side and the second side, and within the opening of each of the plurality of vias, the dielectric layer comprising an epoxy resin; and
- a redistribution layer formed on the dielectric layer, the redistribution layer comprising:
  - an adhesion layer formed on the dielectric layer, the adhesion layer comprising molybdenum;
  - a copper seed layer formed on the adhesion layer; and
  - a copper layer formed on the copper seed layer.

20. The semiconductor device assembly of claim 19, wherein
- the dielectric layer further comprises a through assembly via that extends through the dielectric layer disposed within the opening of each of the plurality of vias,
- each of the through assembly vias extend through the dielectric layer from the first side to the second side of the silicon core structure, and
- each of the through assembly vias has a conductive interconnection formed therein.

\* \* \* \* \*